US008324963B2

(12) United States Patent
Huyart et al.

(10) Patent No.: US 8,324,963 B2
(45) Date of Patent: Dec. 4, 2012

(54) DEMODULATION CIRCUIT

(75) Inventors: Bernard Huyart, Lognes (FR); Kaïs Mabrouk, Arennes/Seine (FR)

(73) Assignee: Groupe des Ecoles des Telecommunications—Ecole Nationale Superieure des Telecommunications, Paris (FR)

( * ) Notice: Subject to any disclaimer, the term of this patent is extended or adjusted under 35 U.S.C. 154(b) by 0 days.

(21) Appl. No.: 13/057,333

(22) PCT Filed: Jul. 29, 2009

(86) PCT No.: PCT/FR2009/000949
§ 371 (c)(1),
(2), (4) Date: Feb. 3, 2011

(87) PCT Pub. No.: WO2010/015739
PCT Pub. Date: Feb. 11, 2010

(65) Prior Publication Data
US 2011/0133830 A1    Jun. 9, 2011

(30) Foreign Application Priority Data
Aug. 5, 2008  (FR) ..................................... 08 04460

(51) Int. Cl.
H04L 27/22 (2006.01)
(52) U.S. Cl. ........ 329/304; 329/305; 329/306; 329/310; 375/329; 375/330; 375/334
(58) Field of Classification Search .......... 329/304–310; 375/329–337
See application file for complete search history.

(56) References Cited

U.S. PATENT DOCUMENTS

| 5,095,536 | A | 3/1992 | Loper |
| 6,335,952 | B1 | 1/2002 | Lee |
| 7,471,939 | B2* | 12/2008 | Yamaji et al. ................. 455/313 |
| 2005/0041759 | A1* | 2/2005 | Nakano .......................... 375/324 |
| 2006/0063504 | A1 | 3/2006 | Bergervoet |

OTHER PUBLICATIONS

International Search Report for PCT/FR2009/000949 dated Jul. 29, 2009.
Park, H., et al., "Unified DC Offset Cancellation and i/Q Regeneration with Carrier Phase Recovery in five port junction based on Direct receivers", Proceedings of the 37th European Microwave Conference, pp. 803-806, Oct. 1, 2007.

* cited by examiner

Primary Examiner — Joseph Chang
Assistant Examiner — Jeffrey Shin
(74) Attorney, Agent, or Firm — Hamilton, Brook, Smith & Reynolds, P.C.

(57) ABSTRACT

In one embodiment, a circuit provides two quadrature components, I and Q, from a received modulated signal, from three mutually phase-shifted components of the received signal. The circuit can demodulate three mutually phase-shifted components of a baseband signal, in order to provide two quadrature demodulation components. The circuit includes three circuit inputs, each designed to received said three components, respectively. The circuit further includes a first and second adder circuit. The circuit also includes a bank of weighting circuits linked, at input, to the three circuit inputs and linked, at output, to the inputs of the first and second adder circuits so as to transmit to each adder input, with a determined weighting, a particular one of said three components, the weightings being chosen so that the first and second adder circuits provide said two quadrature demodulation components.

10 Claims, 11 Drawing Sheets

DEMODULATION CIRCUIT

Figure 1:
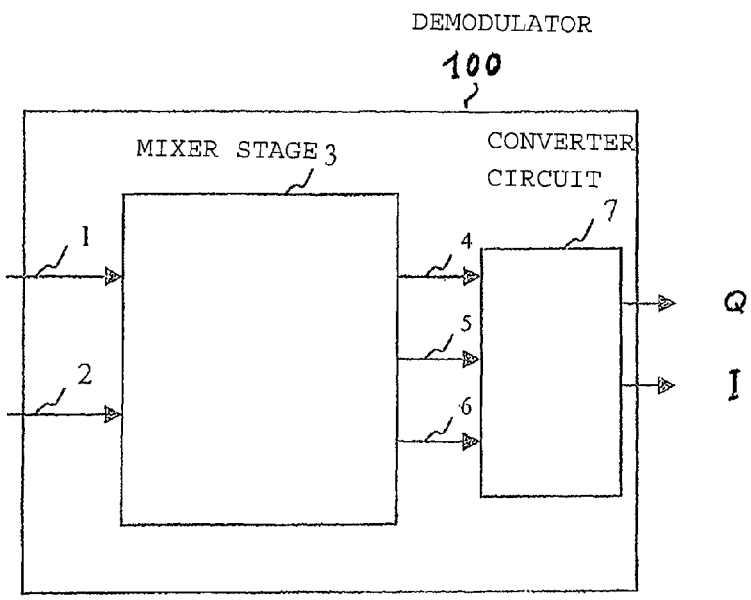

This application is the U.S. National Stage of International Application No. PCT/FR2009/000949, filed Jul. 29, 2009, which designates the U.S., published in French, and claims priority under 35 U.S.C. §§119 or 365(c) to FR Application No. 08 04 460, filed Aug. 5, 2008.

The present invention relates to a conversion device making it possible to convert a set of three mutually phase-shifted components, of a received modulated signal, into two orthogonal modulation components corresponding to the modulation of the emitted signal.

Demodulation, upon receiving a modulated signal, can use several principles.

For example, the demodulator comprises a correlator with five ports, specifically two inputs and three outputs. The inputs respectively receive the signal to be demodulated and the signal from a local oscillator calibrated substantially on the carrier frequency of the received signal. One of these two signals is "divided," over three parallel channels, into three mutually phase-shifted signals by about 120 degrees to thus constitute three pairs of signals. The signals of each pair are then added and the sum signal is applied to a particular quadratic detector, followed by a low-pass filter that only keeps the baseband. It is therefore possible to consider that the two input signals define, by their three phase-shifted components, a 3×3 grid or matrix whereof a diagonal is used, i.e. the intersection points of a same row, i.e. homologues relative to the phase shift.

In another case, the architecture of the demodulator is called "three-phase," the three adders above being replaced by three multipliers, directly followed by the low-pass filters.

Such modulators require that a calibration procedure be carried out, which, traditionally, is done through digital processing or analog circuits. This calibration can be done by using a reflectometer after successive connections of three predetermined loads, e.g. a short circuit, an open circuit and 50 ohms. A manual intervention is, however, necessary.

The calibration can thus use automatic methods such as blind calibration, orthonormalization and equilibration procedures, or the dual-tone method.

The blind characterization, proposed by Yi Liu, Calibrating an industrial microwave six-port instrument using the artificial neural network technique, IEEE Transactions on Instrumentation and Measurements, 45 (2):651-655, 1996, consists of using a neural network established according to learning sequences. However, the necessary learning time can be relatively long, i.e. prohibitive relative to the acceptable adaptation delay in a mobile telecommunications network, for which propagation conditions can vary quite quickly.

For orthonormalization and equalization procedures, the calibration is done by taking into account the signal mixing technique used in five-port demodulators. For example, if non-linear circuits, usually called quadratic power detectors, are used to mix the two input signals, it is then necessary to eliminate the parasitic voltages corresponding to the intermodulation products, in particular second order ones, IMD2. Such a procedure is described by Xinping Huang, Dan Hindson, Michel de Léséleuc, and Mario Caron in the article entitled "I/q-channel regeneration in 5-port junction based direct receivers," which appeared in February 1999 in IEEE MTT-S International Topical Symposium on technologies for wireless applications, pages 169-173. It is taught there to measure the output voltages of the detectors at each symbol time, then a covariance matrix of the voltages is created so as to calculate its eigenvalues. The eigenvectors define the calibration constants.

The dual-tone technique provides that the two input signals are at slightly shifted frequencies. It does allow a reduction of the number of manipulations, but not their complete elimination, and it does not make it possible to correct the thermal drifts of the components.

All of these techniques deal with post-digitization signals, as the mixing of the two input signals occurs using so-called quadratic circuits. The parasitic voltages intrinsically inducted by these considerably reduce the dynamic range of the receiver.

Another problem that arises is that of reducing the DC-offset as much as possible. Thus, R. Sun et Coll. present, in patent US 2006 038534 "DC offset cancellation circuit for receiver", QUALCOMM Inc., dated Apr. 5, 2007, a switch for temporarily disconnecting the receiver from the antenna so as to store the DC offset voltages due to leakage of the local oscillator. However, such a circuit is an additional circuit, dedicated to that specific problem, i.e. represents an increase in the volume of the equipment and only deals with those leaks.

Eliminating second-order intermodulation components is also another problem. Thus, the publication of patent application WO 2008/021815 A1, teaches a circuit for detecting intermodulation using a digital correlation calculation, and converting into an analog signal that is taken from the input signal. However, this technique requires Digital-to-Analog Converters (DAC), and a distortion computation device. The article by Mike Faulkner, "DC Offset and IM2 Removal in Direct Conversion Receivers" IEE Electronics Letters, vol. 149, n° 3, pages 179-184, June 2002, proposes an assembly for reducing intermodulation and DC-offset. By measuring the square of the power, a copy of the parasitic distortion signal is created in an analog manner, to then remove it from the wanted signal. However, this technique requires providing, on each output channel, for a power detector, a filter, and a variable-gain amplifier, which represents a considerable increase in the volume of the equipment.

The present invention aims to propose a circuit for providing two quadrature components, I and Q, from a received modulated signal, from three mutually phase-shifted components of the received signal, this circuit making it possible to deal with at least one of the abovementioned problems and with great savings in terms of circuits.

To that end, the invention first relates to a circuit for demodulating three mutually phase-shifted components of a baseband signal, in order to provide two quadrature demodulation components, characterized in that it includes:
 three circuit inputs, designed to received said three components, respectively,
 first and second adder circuits, and
 a bank of weighting circuits linked, at input, to the three circuit inputs and linked, at output, to the inputs of the first and second adder circuits so as to transmit to each adder input, with a determined weighting, a particular one of said three components, the weightings being chosen so that the first and second adder circuits provide said two quadrature demodulation components.

Each of the first and second adder circuits thus receives several input signals with a weighting that ensures good equilibration of the signal relative to several parameters.

A structure according to the invention makes it possible, owing to the equilibration obtained by the weighting, to cancel the DC-offset, i.e. the three DC offsets of the three input signals neutralize each other by vector composition. The DC offset residue at output I and Q therefore represents the traditional input level present, but divided by a factor much greater than 1. It follows that the measuring dynamics can be increased by that same factor, since the saturation of the dynamics is "delayed" by as much.

Moreover, this equilibration makes it possible to compensate for parasitic phase rotations in the frequency band used, i.e. the cross-coupling of the inputs towards the two adder circuits makes it possible to mutually control the two signals I and Q so as to keep them phase-shifted within a relatively narrow phase fluctuation band around the desired 90 degrees, and over a relatively broad frequency band.

The cross-coupling above also makes it possible to ensure good rejection by neutralization of the parasitic signals between adjacent or close channels, e.g. second-order intermodulation signals, which are the most bothersome.

In one embodiment, at least one of the first and second adder circuits is linked at input to three of the weighting circuits.

In particular, the first and second adder circuits can be linked at input to three of the weighting circuits.

In one very general embodiment, the bank includes six weighting circuits.

The weighting circuits can each have a predetermined weighting factor.

This is an interesting feature, which shows that there is no need to perform the slightest adaptation process during operation. There is therefore no need for weighting adjustment circuits. It will, however, be understood that it is completely possible for the weightings to be adjusted by programmable memory points, which will thus make it possible to use a same type of converter circuit according to the invention in various demodulators each processing signals in a frequency range unique to it and which can require choosing a set of weighting parameters that are optimized for that specific application.

In one interesting embodiment, the first adder circuit includes a first amplifier including first and second inputs, inversion and direct inputs, respectively, connected to two said circuit inputs by first and fifth weighting circuits, respectively.

This embodiment is thus particularly integrated since an amplifier, for example operational, is positioned so as to perform a signal sum or difference operation, with any desired amplification, i.e. one said weighting.

One of said inputs of the first amplifier can also be linked to a second of said circuit inputs by a third weighting circuit.

A same amplifier, for example operational, can thus perform the composition of three signals, with the desired weighting.

The second adder circuit can include a second amplifier, for example operational, whereof an adder input is linked to two circuit inputs through second and sixth weighting circuits, and a third amplifier, for example operational, has an adder input linked to the second circuit input through a fourth weighting circuit and also linked to an output of the second operational amplifier through a seventh weighting circuit.

The fourth weighting circuit can have a weighting coefficient with a value substantial twice that of a weighting coefficient of the seventh weighting circuit.

The invention also relates to a demodulator having an output stage including a circuit according to the invention.

The invention lastly relates to a method for demodulating three mutually phase-shifted components of a baseband signal, so as to provide two quadrature demodulation components, characterized in that:

receiving the three mutually phase-shifted components, one performs a weighting thereof, and first and second additions of signals thus weighted are done, to respectively provide the two said quadrature demodulation components.

Figure 2:
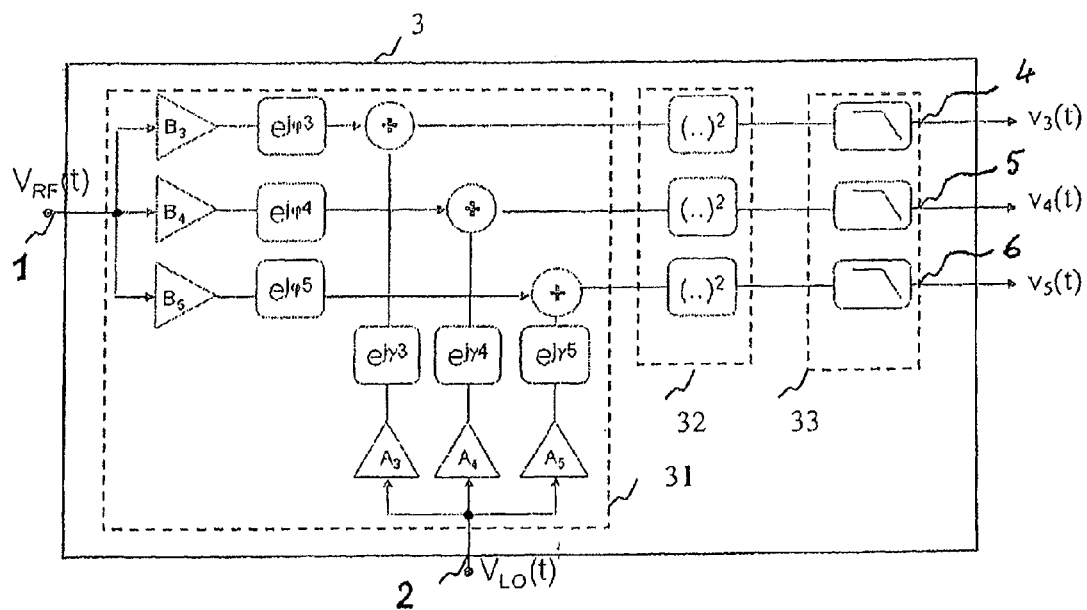
Figure 3:
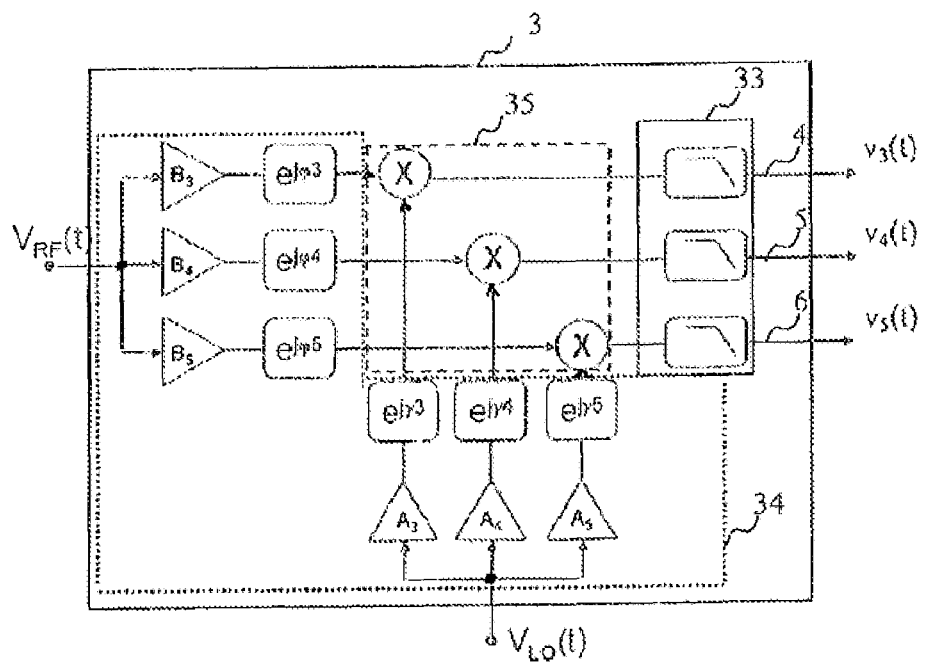
Figure 4:
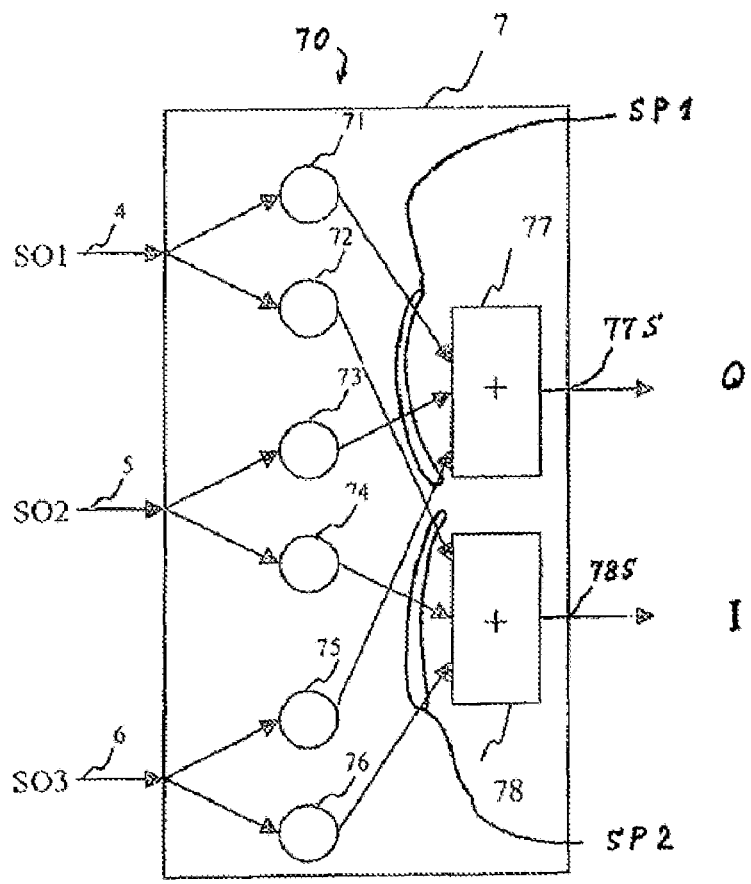
Figure 5:
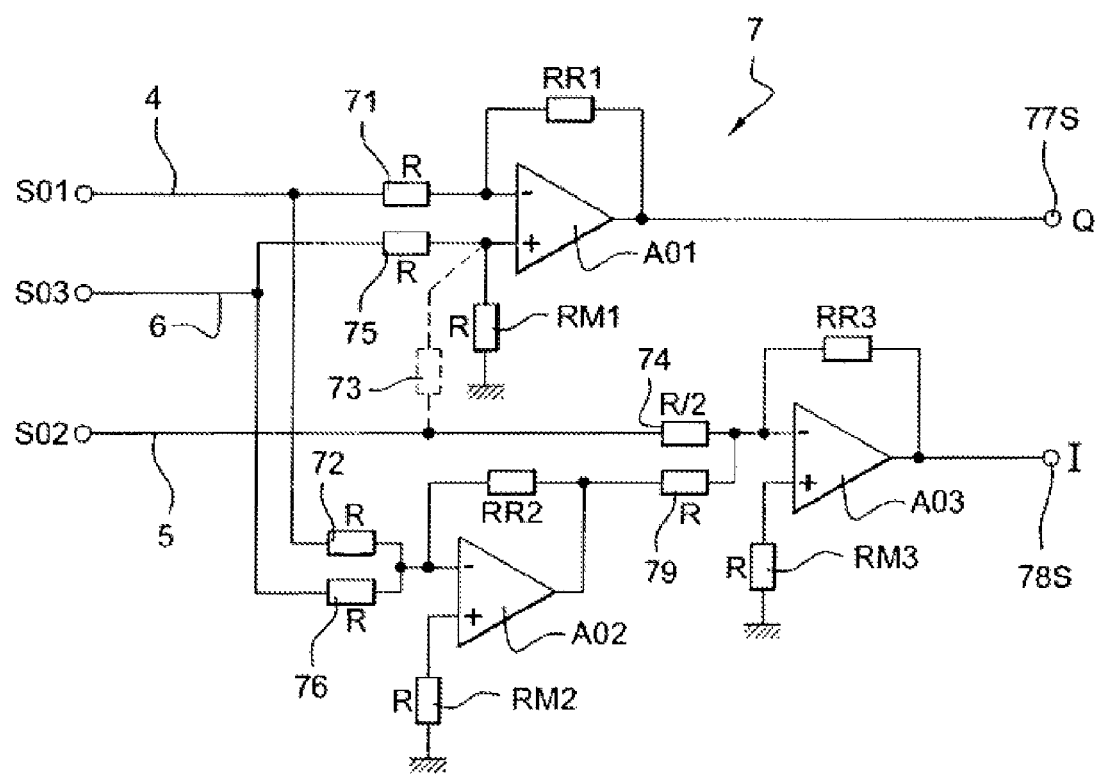
Figure 6A:
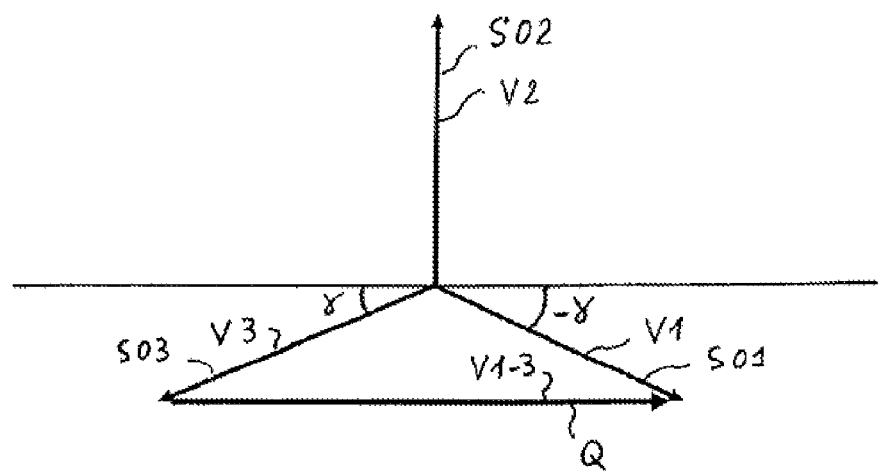
Figure 6B:
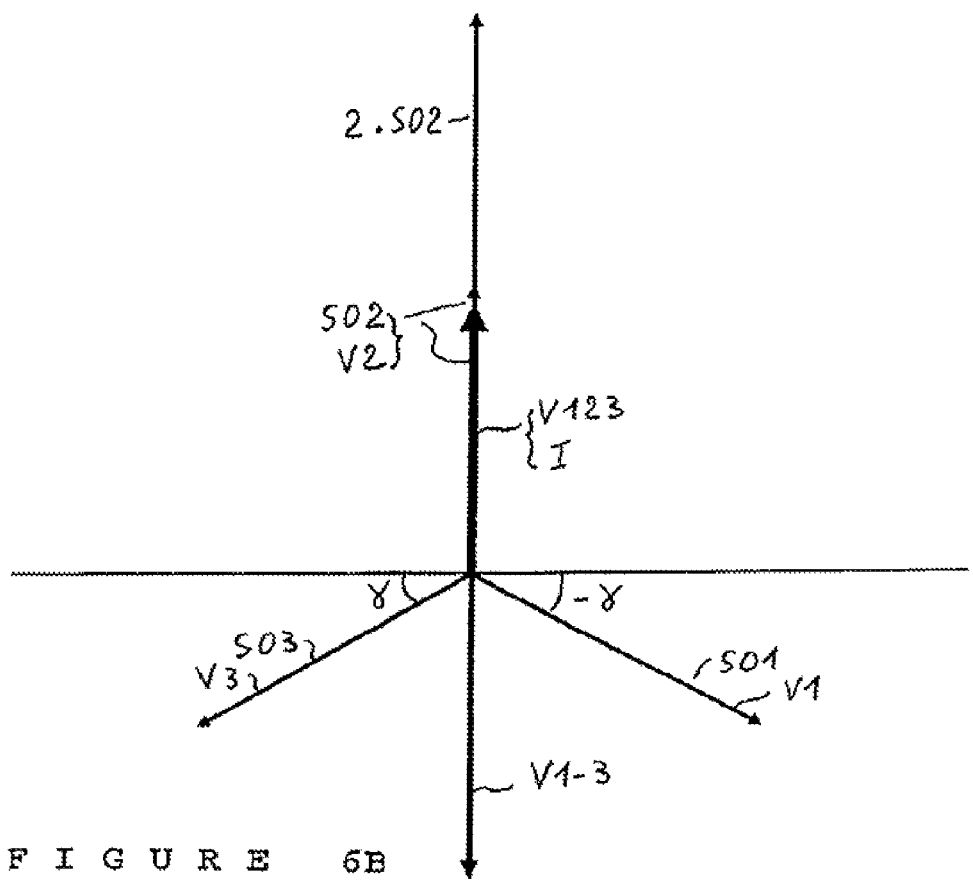
Figure 6C:
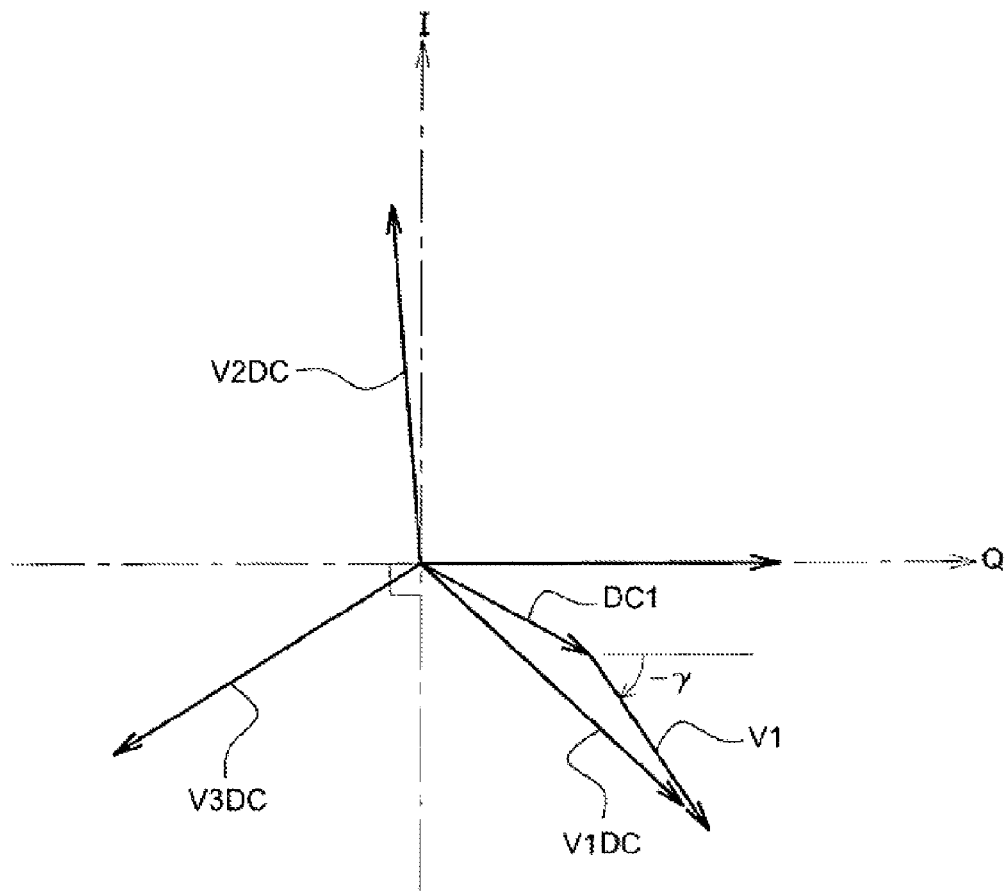
Figure 7:
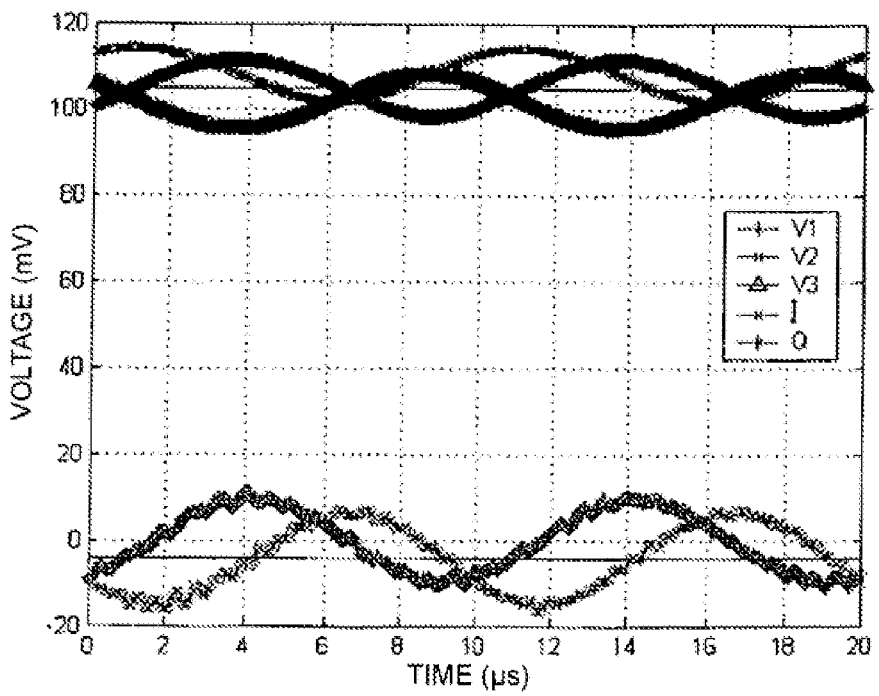
Figure 8:
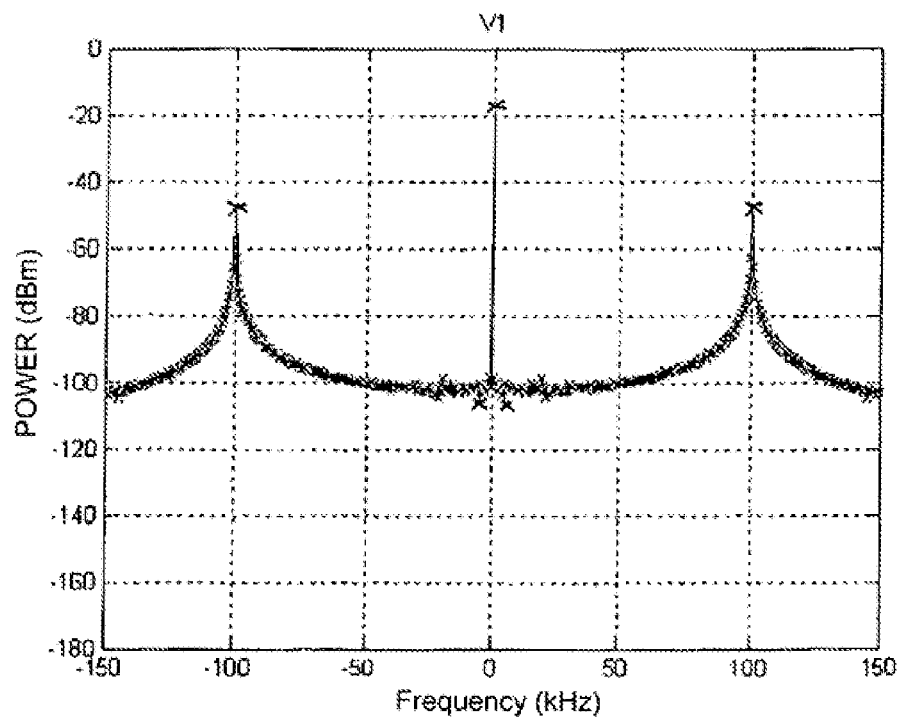
Figure 9:
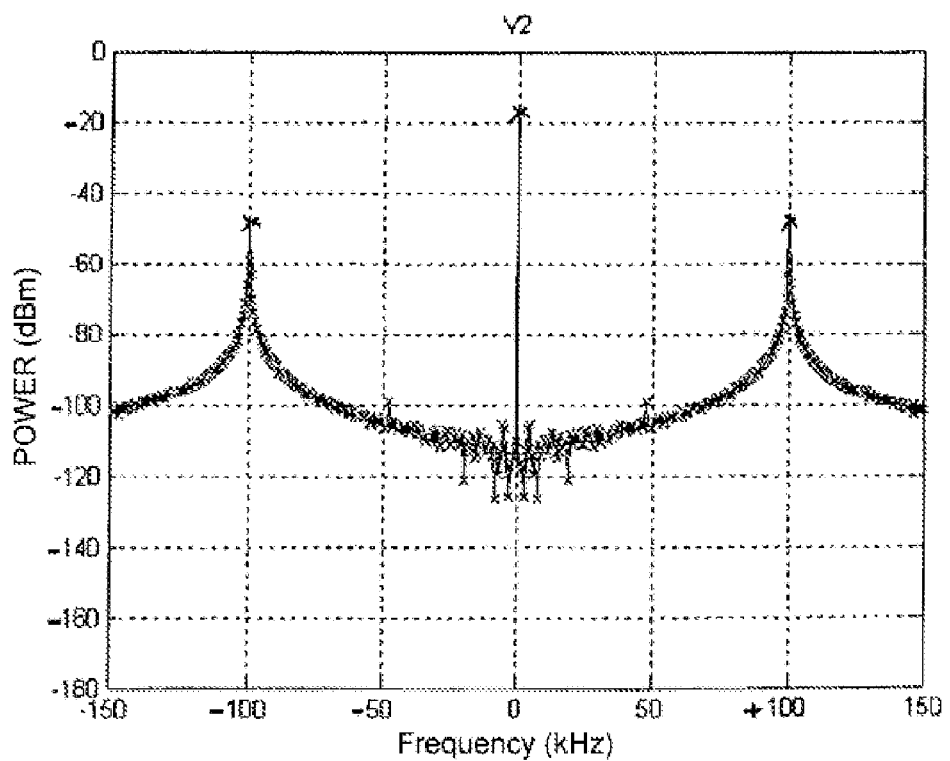
Figure 10:
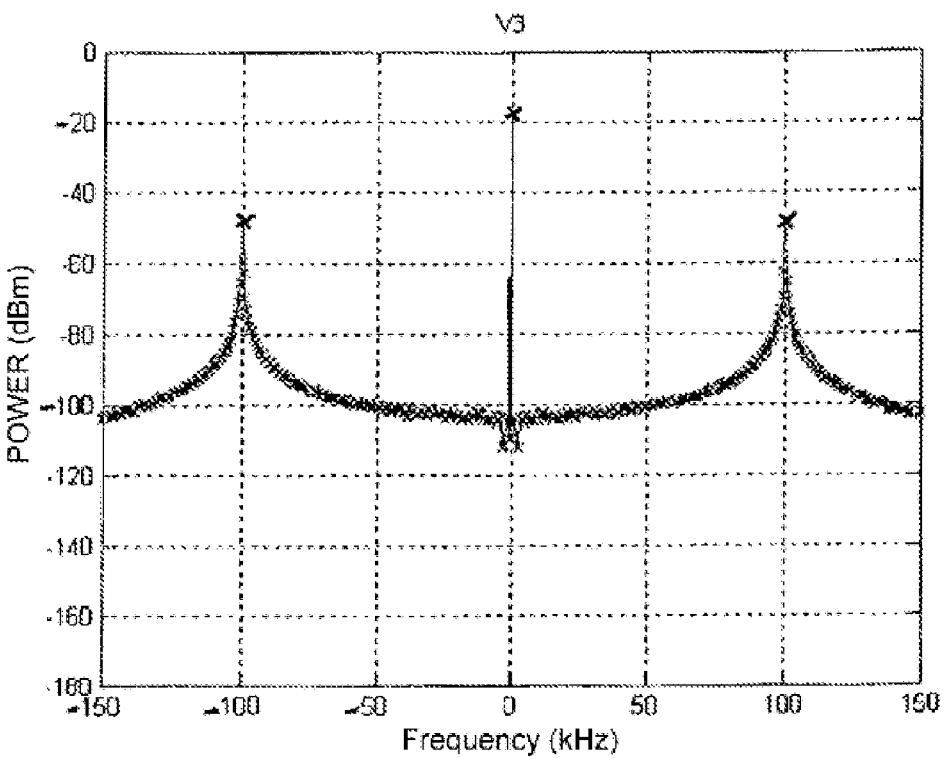
Figure 11:
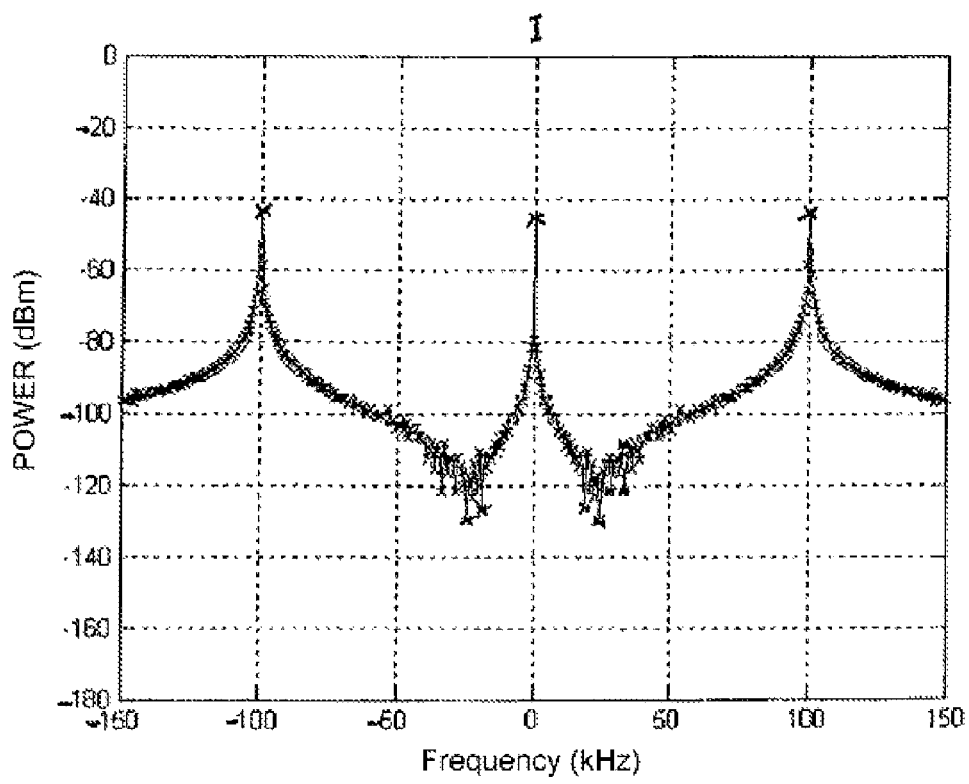
Figure 12:
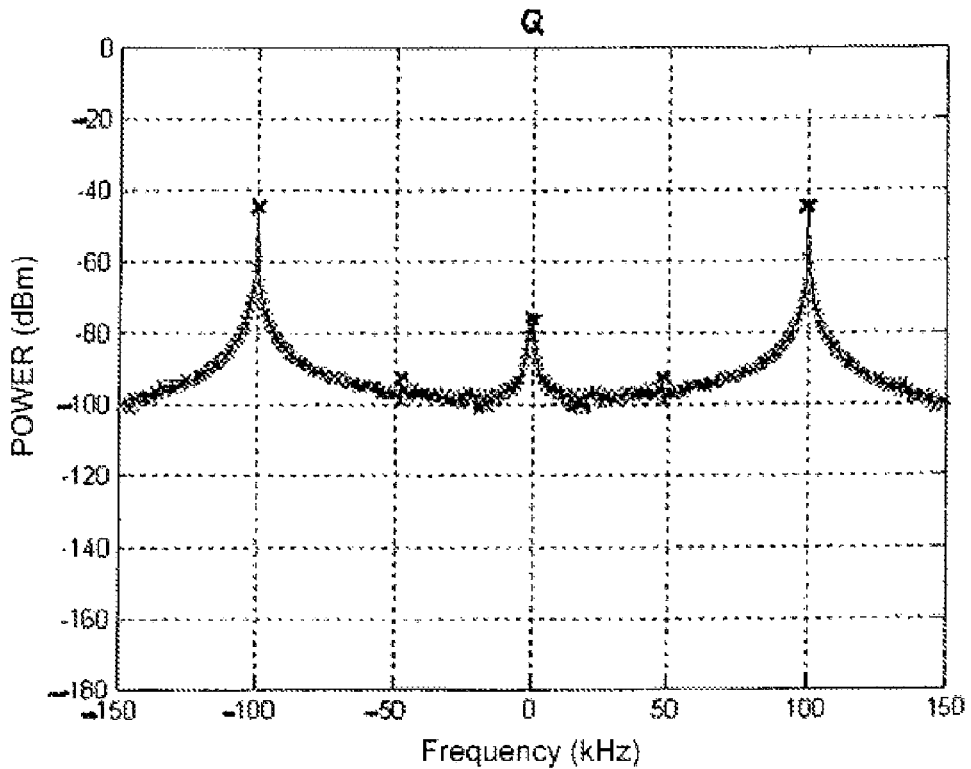
Figure 13:
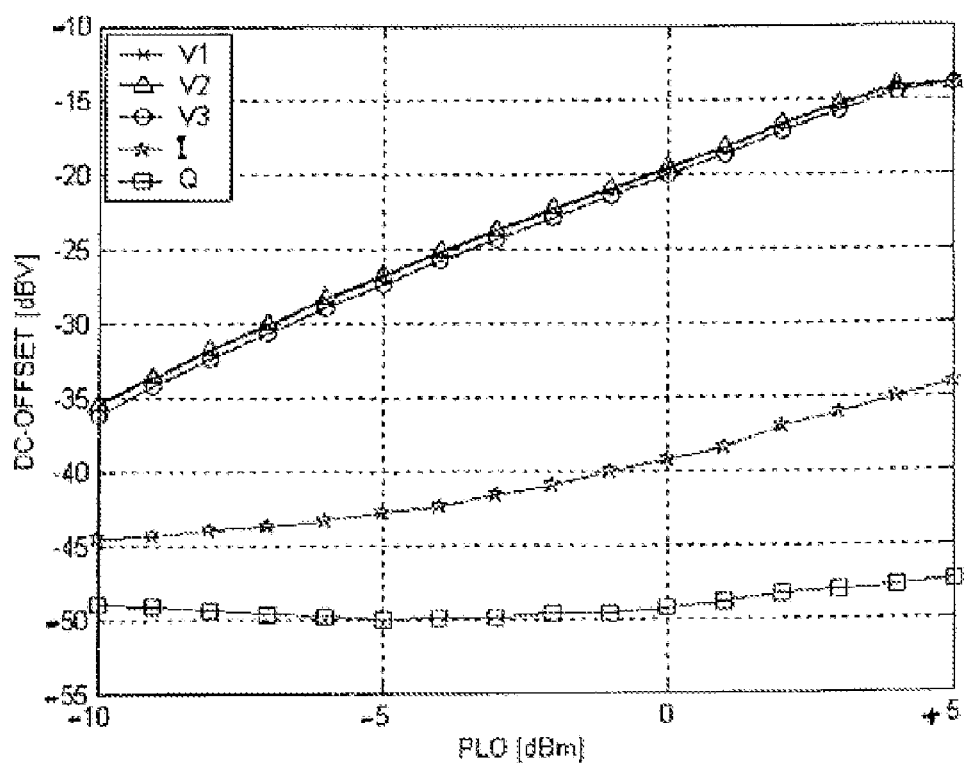
Figure 14:
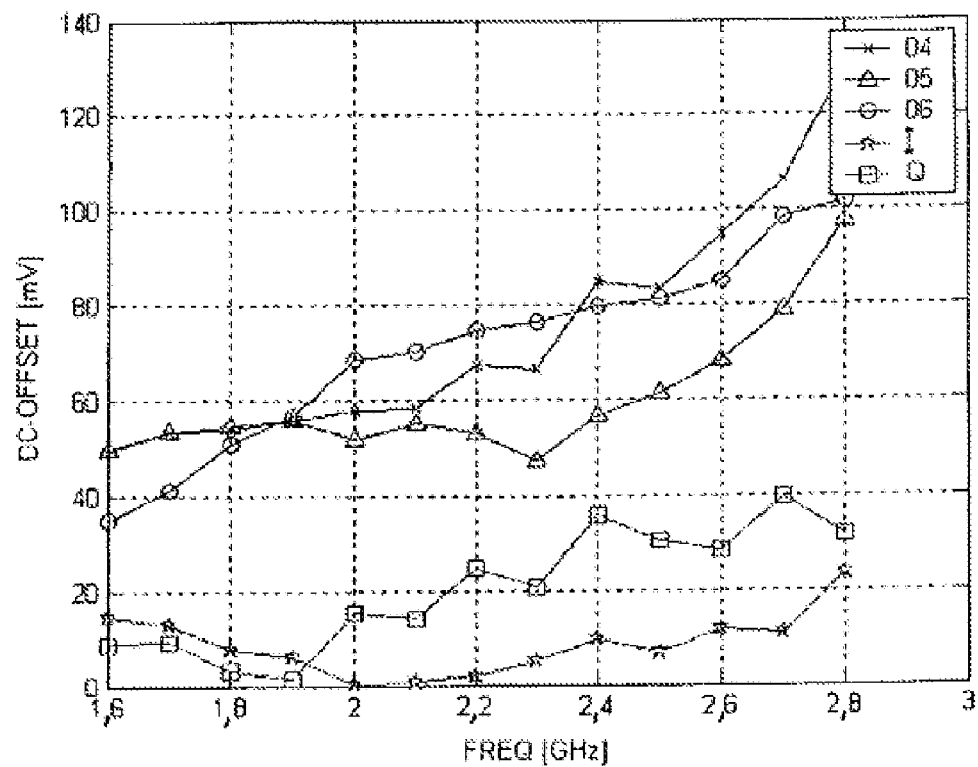
Figure 15:
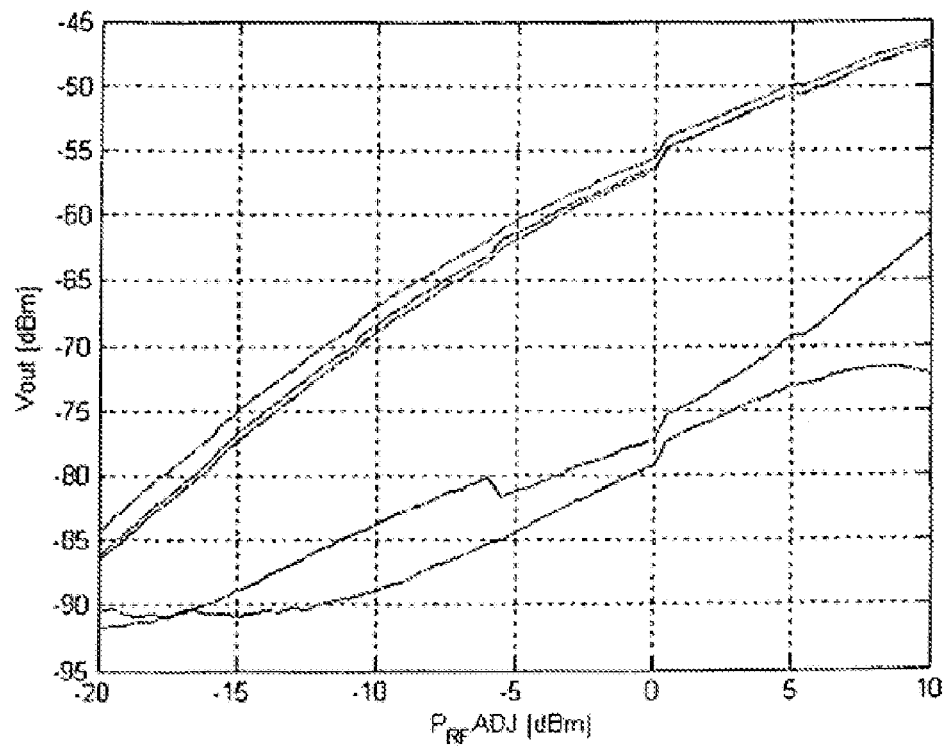
Figure 16:
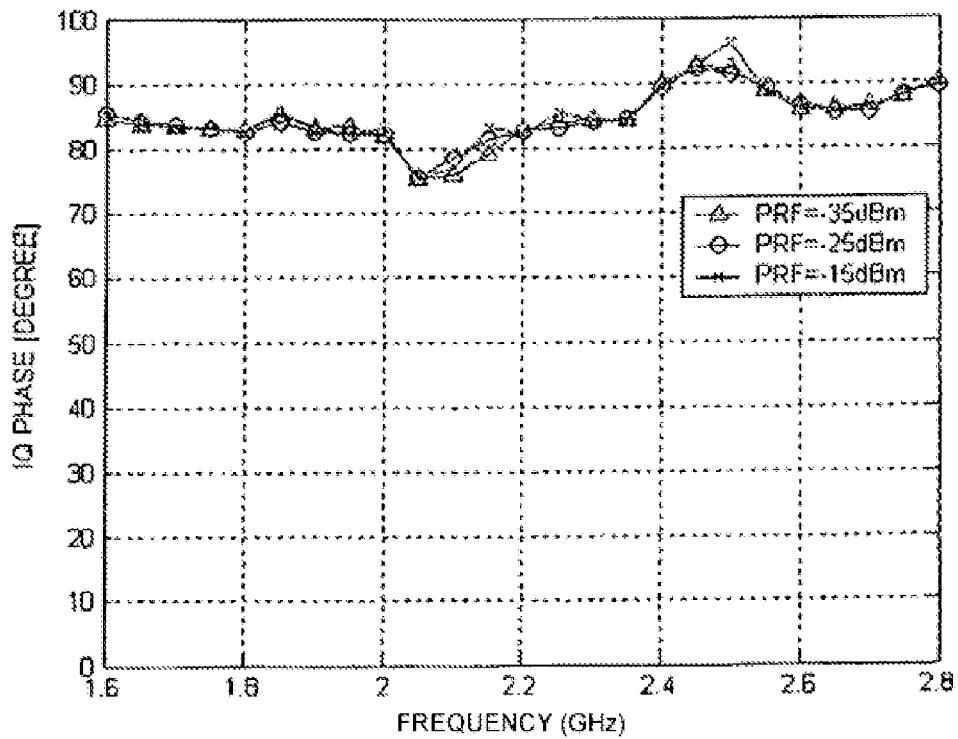
Figure 17:
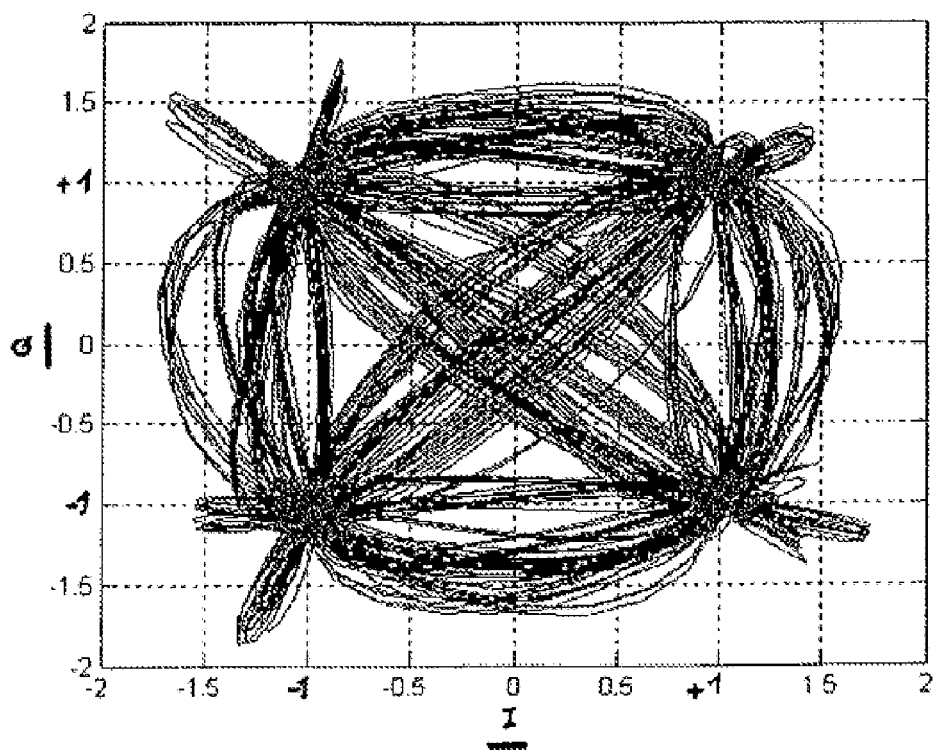
Figure 18:
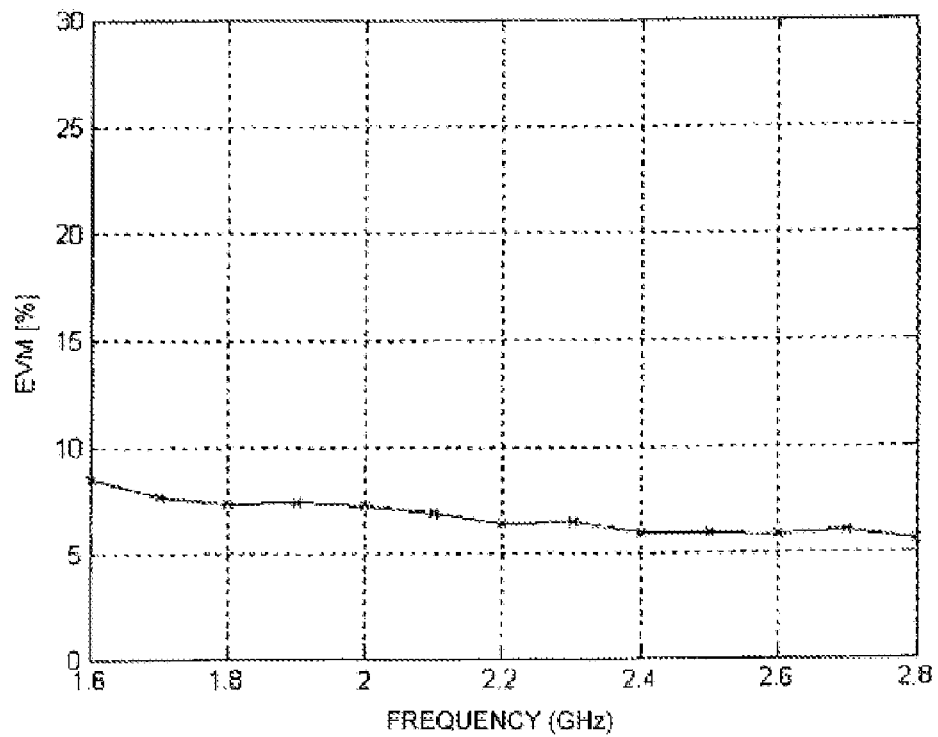

The invention will be better understood using the following description of an embodiment of a demodulation and processing circuit for eliminating parasitic components according to the invention as well as a demodulator including such a circuit, and from the description of one embodiment of a corresponding method, in reference to the appended drawing, in which:

FIG. 1 is a schematic diagram illustrating the usage framework of a circuit according to the invention, in a demodulator of the five-port type or the three-phase type, FIG. 2 shows a traditional demodulator with a five-port correlator, FIG. 3 shows a traditional three-phase demodulator, FIG. 4 is a functional block diagram illustrating the circuit according to the invention, FIG. 5 is a detailed diagram of an assembly of analog circuits making up a circuit according to the invention, FIG. 6 is made up of FIGS. 6A, 6B and 6C, FIGS. 6A and 6B showing a signal composition vectorial diagram of the circuit of FIG. 5 to obtain the component, imaginary component Q and real component I, respectively, and FIG. 6C is a signal composition vectorial diagram of the circuit of FIG. 5 and DC-offset signals, FIG. 7 shows three input voltages of the circuit of FIG. 5 and the output voltages representing the two components I and Q, FIGS. 8, 9 and 10 show a respective power spectrum of the three input voltages of FIG. 7, FIGS. 11 and 12 show a respective power spectrum of the two output components I and Q of the circuit of FIG. 5, FIG. 13 shows the evolution of the DC-offset level of the three inputs and the two outputs of the circuit of FIG. 5, as a function of a local oscillator power, FIG. 14 shows the evolution of the DC-offset level of the three inputs and the two outputs of the circuit of FIG. 5, as a function of a local oscillator frequency, FIG. 15 shows a second-order intermodulation baseband product due to mixers upstream of the circuit of FIG. 5, as a function of the power of an adjacent bi-tone channel, FIG. 16 shows the phase shift between the output components I and Q for a frequency range from 1.6 to 2.8 GHz, FIG. 17 shows a QPSK constellation demodulated from outputs of the circuit of FIG. 5, and FIG. 18 shows the result of EVM (error vector magnitude) measurements done on the constellation of FIG. 17.

FIG. 1 shows a demodulator 100 made up of two serial functional blocks, i.e. a mixer stage 3, followed by a converter circuit 7, according to the invention, providing the two mutually orthogonal components I and Q of the modulated signal, from three components of a received modulated signal, phase-shifted and processed in the mixer stage 3.

The mixer stage 3 mixes a modulated signal, here at a high frequency in the gigaHertz range, signal called RF, applied to a first circuit input 1, with a local oscillator signal applied to a second circuit input 2. The mixer stage 3 "divides" the RF signal into three signals over a first set of three respective channels. The local oscillator signal of the second circuit input 2 is divided into three channels, the first channel being phase-shifted by 120 degrees in one direction relative to the second channel and the third channel being phase-shifted by 120 degrees in the opposite direction. The signal of the local oscillator is thus transformed into a regular star.

A sort of 3×3 grid is thus defined and the intersection points of the three pairs of homologous signals, i.e. with the same channel number, include a mixer element. In the case of FIG. 2, which shows a mixer stage 3 of the correlator type, each mixing is done by an adder element, in the block referenced 31. A downstream quadratic detector completes the mixing operation. In the case of FIG. 3, the mixer stage 3 on the other hand includes a multiplier element, in the block referenced 35.

At the input of block 31 in FIG. 2, and in an output stage of a phase-shifting frontal block 34 of FIG. 3, the terms at Ai and Bi (i=3, 4, 5) represent a gain, or an attenuation, and the terms at $e^{j\Phi i}$ represent phase rotations, which here are all equal, i.e. without mutual phase shift between the three channels.

A bank of three low-pass filters 33 filters the three RF signals transposed in baseband and transmitted to three respective connections 4, 5, 6 at output of the demodulator circuit 3, according to three signals vi(t). In this description, references 4, 5, 6 designate both the above connections and their downstream ends, i.e. first, second and third circuit inputs of the converter circuit 7. In FIG. 2, a bank of quadratic detectors 32 is inserted between the outputs of the phase-shift and adder circuit 31 and the bank of filters 33, since the mixing is done by adder elements.

In reference to FIG. 4, the converter circuit 7 thus has, at input, the incoming cable of the three connections 4, 5, 6, or circuit inputs, transmitting respective signals SO1, SO2, SO3 (aka v3(t), v4(t), v5(t) mentioned above), and it has two outputs 77S and 78S for components Q and I, respectively. The converter circuit 7 has a bank 70 of weighting circuits, linked to the three connections or circuit inputs 4, 5, 6 that are designed to receive the three mutually phase-shifted components SO1, SO2, SO3 and provide, in response, two subsets of weighted signals SP1, SP2 to first and second adder circuits 77 and 78, respectively, with sign, respectively providing the two quadrature demodulation components Q, I at the respective outputs 77S and 78S. This therefore involves weighting and mixing of the three components SO1, SO2, SO3.

The bank of weighting circuits 70 here includes six weighting elements, grouped into first, second and third pairs of weighting elements 71-72, 73-74, and 75-76. The first pair of weighting elements 71-72 serves to perform weighted mixing of the first signal SO1 towards the first and second adder circuits 77, 78. The first and second weighting elements 71-72 making up the first pair are thus each linked, at input, to the first circuit input 4, the weighting element 71 being linked to a first input of the first adder circuit 77 and the weighting element 72 being linked, at output, to a first input of the second adder circuit 78.

Following the same principle, the third and fourth weighting elements 73-74 making up the second pair are each linked, at input, to the second circuit input 5, the third weighting element 73 being connected, at output, to a second input of the first adder circuit 77 and the fourth weighting element 74 being linked, at output, to a second input of the second adder circuit 78.

Still following the same principle, the fifth and sixth weighting elements 75-76 making up the third pair are each linked, at input, to the third circuit input 6, the fifth weighting element 75 being linked to a third input of the first adder circuit 77 and the sixth weighting element 76 being linked, at output, to a third input of the second adder circuit 78.

FIG. 5 is a diagram of one embodiment of an assembly performing the functions of the converter circuit 7. For simplification and speed of the processing, the illustrated assembly is based on operational amplifiers and resistors, i.e. the processing is done on analog signals. The weighting elements 71, 73, 75 determine respective mutual gains −1, 0, +1, for the first subset SP1 and the weighting elements 72, 74, 76 determine respective mutual gains +1, −2, +1 for the second subset SP2. The set of these gains can be multiplied by any coefficient, positive or negative, greater than or less than 1, since it is the relative amplitude between these gains that matters. Since it involves a three-phase assembly, it is also possible to perform a circular permutation of the three gains above of each of the two subsets SP1 and SP2, i.e. for example gain 0, in the second row, can also occupy the first or third row, and, likewise, for example gain −2, in the second row, can also occupy the first or third row. Given the possible inversion of the sign of the gain, the diagram in FIG. 5 allows six sets of six gains each.

The assembly of FIG. 5 includes a first operational amplifier AO1 providing the signal for imaginary component Q from signals SO1 and SO3. To that end, the traditional inversion input of such an operational amplifier AO1 is associated with the middle point of a first two-terminal feedback network 71, RR1 forming a divider bridge, here purely resistive.

Thus, the two ends of the first feedback divider bridge 71, RR1 are respectively linked to the first circuit input 4 and the output of the operational amplifier AO1, the middle point therefore being linked to the inversion input of the first operational amplifier AO1. The parallel resistor RR1 is therefore connected in feedback to stabilize the assembly and the value of the series resistor 71 is chosen at a given percentage of the value of the resistor RR1, to thus set the gain. Because of this, and to be strict, the weighting element 71 of FIG. 4 is in fact made up of the first two-terminal network 71, RR1. For simplicity of this description, the feedback resistor RR1 is assumed to be set beforehand and it is therefore then the value of the series resistor 71 that sets the weighting coefficient.

The two ends of a divider bridge 75, RM1, with input polarization, are respectively linked to the third circuit input 6 and the mass, the middle point therefore being linked to the direct input, i.e. without inversion, of the first operational amplifier AO1. The shunt resistance RM1 thereby ensures a polarization return towards a fixed voltage reference and its value serves as a reference to choose the value of the series resistor 75 in order to set the desired weighting.

It will be noted that, in this example, the weighting element 73 is only mentioned by dotted lines, because the weighting factor is equal to zero. Otherwise, there would be a resistor linking the second circuit input 5 to the middle point of the divider bridge 75, RM1, i.e. the direct input.

The signal of real component I of the envelope of the signal to be demodulated is provided by an assembly based on second and third series operational amplifiers AO2 and AO3. All of the above amplifiers are marketed under reference LM6142 by the company National Semiconductor. The second operational amplifier AO2 is associated with a second two-terminal feedback network 72, RR2 according to the diagram provided for the first two-terminal network 71, RR1, the explanation for which will therefore not be repeated. The first signal SO1 is thus applied in a weighted manner on the inversion input of the second operational amplifier AO2. However, the second two-terminal network 72, RR2 is integrated in a Y-shaped structure, i.e. its middle point is also linked to the third circuit input 6, for the third signal SO3, through a resistor 76. The direct input of the second operational amplifier AO2 is returned to the mass by a resistor RM2. The Y-shaped structure thus constitutes an adder for the first and third signals SO1 and SO3.

The third operational amplifier AO3 is likewise polarized, at an inversion input, by a third two-terminal network 74, RR3 linked to the second circuit input 5. Here again, the third two-terminal network 74, RR3 is integrated into a Y-shaped structure, with a resistor 79 that links the output of the second operational amplifier AO2 to the middle point of the third two-terminal network 74, RR3. The Y-shaped structure thus constitutes an adder for, on one hand, the weighted partial sum signal of the first and third signals SO1 and SO3, and, on the other hand, the second signal SO2. The direct input of the third operational amplifier AO3 is returned to the mass by a resistor RM3.

In this example, the feedback resistors RR1, RR2, RR3 all have the same value, for example a value in the range from 1 to 10 kΩ. Likewise here, the series weighting resistors 71, 72, 75, 76 have a same value in that range. Precisely, in this particular example, all of the various resistors above have a same value, aside from resistor 74, which has a half-value. In this way, the gain of the first and second operational amplifiers AO1 and AO2 has a single absolute value, i.e. for the first and third signals SO1 and SO3. The absolute value of the gain is, however, 2 for the second signal SO2. The resistors 71 to 76 thus define, in that order, a set of gains equal to: −1, +1, 0, −2, +1, +1.

It will, however, be noted that nothing opposes, in terms of the principle, the weighting and addition functions being done after passing through three analog-to-digital converters.

Likewise, the use of active components, in the form of operational amplifiers, is optional. Indeed, inasmuch as the three input signals SO1, SO2, SO3 are provided by impedance circuits with a low enough output, it is possible to perform the weighted addition of the three signals by supplying a shared resistor, constituting a core constituting the adder circuit 77 or 78, with three resistors (71, 72, 73 or 74, 75, 76) forming the arms of the Y converging towards a same end thereof, its other end being polarized at a reference voltage, for example the mass. The two preceding Y-shaped structures, cascading, are thus integrated into a single structure. The voltage at the terminals of this shared resistor can possibly serve to control the base or the gate of a downstream transistor that will amplify the signal of component I or Q at a level better exploitable by downstream circuits exploiting said signals. Moreover, the above transistor, which may belong to an operational amplifier, will reproduce the signal under a reduced impedance, several ohms or tens of ohms, relative to the order of magnitude of the weighting resistors 71-76, which are in the order of magnitude of the kilo-ohm. The output of the impedance-lowering transistor therefore constitutes a source of voltage, i.e. a voltage practically insensitive to the charge presented by the input of the downstream exploitation circuit, in a range of currents provided for that output.

Since it involves weighting each input signal, one sees that the resistive divider bridges above are only one particular embodiment of this function, that embodiment however being very simple since the resistors can be made easily, for example by discrete components in the form of chip resistors welded on a connection circuit, or in a more integrated form, i.e. resistive ink tracks, for example in a thick layer, or in the form of a resistive volume in a semiconductor chip constituting the device according to the invention. In other embodiments, the divider bridge can be based on capacitors or inductive elements. A weighting corrector circuit can also be provided in a frequency range within the global range provided, the corrector circuit increasing or decreasing the amplitude of the considered signal applied on the adder circuit. In general, the above weighting can also be done without using the divider bridge, and for example by using a gain-controlled amplifier or a signal processing circuit, DSP. The latter solution is, however, heavier to implement.

Relative to a solution only using passive components, it will, however, be noted that the presence of an operational amplifier, one input of which is linked to the end of the shared resistor constituting the convergence point of the three branches, provides a disconnection between the branches, i.e. prevents a fraction of each of the three signals SO1, SO2, SO3 from being reinjected towards the other two inputs among the circuit inputs 4, 5 or 6. Indeed, an operational amplifier input only varies very little in voltage and thus constitutes a fictitious mass that ensures the disconnection between the various tributary branches. It can therefore be tolerated for the output impedances of the circuits controlling the circuit inputs 4, 5, 6 to be relatively high, i.e. to exceed several tens of ohms.

FIG. 6A illustrates the determination of a vector V1-3 representing the signal of imaginary component Q. FIG. 6A shows the vectorial diagram V1, V2, V3 of the three signals SO1, SO3 and SO2, the latter being shown oriented vertically upwards. The signal of imaginary component Q is therefore made up of the vector difference V1-3 between the signals SO1 and SO3, both descending to 30 degrees towards the right or left, by an angle γ of about 30 degrees on the horizontal. The signal of imaginary component Q is therefore equivalent to √2 relative to the amplitude of the input signals SO1, SO3 and is represented by the horizontal vector V1-3, therefore perpendicular to the vector V2 of the second signal SO2. It will be understood that, in the description below, it is the vector V2 that serves as orientation reference to define the horizontal, which is perpendicular thereto, i.e. the description would remain valid, with the desired transposition, if the set of vectors V1, V2, V3 globally underwent a certain rotation.

The horizontality of the vector V1-3 is therefore due to the fact that the two vectors V1 and V3 have a same vertical component, i.e. their free ends have a same height. This condition is obtained here by the equality of the amplitudes of vectors V1 and V3 and their same absolute value of angle γ relative to the horizontal or vertical (vector V2). It is therefore the suitable choice of the pair of values of the two amplitude and angle parameters that makes it possible to establish the desired horizontality, i.e. the cancellation of any difference of the vertical components of the vectors V1 and V3. It is, however, seen that the effect of a choice of different descent angles can be compensated for by shortening or lengthening one of the vectors V1, V3, to thus reestablish the horizontality of the vector V1-3. In other words, the two free ends of the first and third vectors V1 and V3 can "slide" on a same horizontal.

FIG. 6B illustrates the determination of a vector V123 representing the signal of real component I. One sees that the sum of the first and third vectors V1 and V3 representing the signals SO1 and SO3, inclined symmetrically relative to the vertical, provides a descending vertical vector V1-3 with a value of about 2×sin−30 degrees, i.e. an amplitude equal to that of the individual signals SO1 or SO3. Given the inversion caused by the second operational amplifier AO2, the third operational amplifier AO3 performs a difference calculation using formula: 2V2−V1-3, vectors V1-3 and V2 being collinear and opposite and having substantially the same amplitude. The result vector V123 is therefore vertical and rising and has a unitary amplitude, i.e. substantially equal to that of signals SO1, or SO2 or SO3.

It will be noted that the verticality of vector V123, i.e. the cancellation of the horizontal components, is related to the fact that the opposite horizontal components of vectors V1 and V3 have the same amplitude, because the vectors V1 and V3 themselves have the same amplitude and are inclined the same way, with the exception of the sign, on the vertical or horizontal. One sees that, if one of these two parameters, amplitude or incline, varies relative to the conditions described for this example, the other parameter makes it possible to compensate for the effect of that variation to reestablish the equality of the amplitudes of the horizontal components of the respective vectors V1 and V3.

It will also be noted that the relative phase correction between the two output components I and Q can also, dually, be done by causing, on the output component I or Q not affected by the parasitic phase shift, a correction phase shift equal to the parasitic phase shift. In this way, the set of two output components I and Q turns in a block and therefore preserves the desired relative phase shift.

The diagram of FIG. 5 shows a simple and effective embodiment for obtaining the two output vectors V1-3 and V123 depending on the desired amplitudes and a phase shift close to 90 degrees targeted. One sees that the variation range around the perfect quadrature condition depends on the contemplated use, and that in particular this range can be enlarged if the transmission rate of the symbols thus transmitted is reduced. It is for example possible to set a margin of ±30 degrees. In a similar case, it will be possible to tolerate a dispersion of the individual gains in the above sets of about 70%.

Demodulation tests using the converter circuit 7 as output stage of a mixer circuit 3 have shown that the converter circuit 7 would procure a quality gain regarding the DC-offset, the measuring dynamics offered, and the intermodulation, in particular second-order.

Regarding the DC-offset, DC-offset voltages measured at the outputs 4, 5, 6 of a five-port mixer circuit 3 were around 100 mV. On the other hand, these same voltages applied to the converter circuit 7 yield about 4 mV on the signal of real component I and a bit more than 0.1 mV on the signal of quadratic component Q, i.e. a reduction by a respective factor of about 25 and a little less than 1000.

FIG. 6C illustrates the DC-offset, with a first offset vector DC1 that is added, substantially collinearly, to the first vector V1 to form a first sum vector V1DC. Likewise, vector V2 is affected by a second rising DC-offset vector, substantially collinear (not shown), from which a second sum vector V2DC results. The third vector V3 is likewise affected by a third DC-offset vector substantially collinear with the third vector V3, from which a third sum vector V3DC results. One therefore sees that the vectorial addition of these three offset vectors leads to a cancellation thereof.

Regarding the measuring dynamics, the peak value of the above parasitic fluctuations is brought back to about 10 mV, i.e. reduced by a factor of 10. The measuring dynamic is therefore increased by as much.

Regarding the second-order intermodulation, which is the most bothersome, due to the mixers of the circuits 3, the converter circuit 7 provides an improvement through attenuation by a factor of about 100.

FIG. 16 illustrates the stability of the orthogonality of channels I and Q. Indeed, the phase shift, in a frequency band from 1.6 to 2.8 GHz, remains within a margin of −15 to +6 degrees around the 90 degrees required, the descent below 80 degrees also being limited to a narrow zone of frequencies going from 2 to a little more than 2.1 GHz.

As mentioned above, it is possible to provide for offsetting the drift peaks at maximum phase shift, here −15 degrees, while providing that some of the weighting elements 71-76 are substantially at the frequency, i.e. the weighting factor they provide is somewhat modulated as a function of the frequency. Indeed, if one increases the ratio of the imaginary component Q relative to the real component I, here by increasing the weighting factor of the weighting elements 71 and 75 of the first subset SP1 or decreasing the weighting factor of the weighting elements 72, 74, 76 of the second subset SP2, for example by increasing their series impedance value, the imaginary component Q is thus favored. The variation of the weighting factor can for example be done by integrating a wave trap L, C in series in the branch, series 71 or 75 or feedback RR1, with a divider bridge whereof the impedance must increase in a frequency range. Dually, a series circuit L, C can also be inserted to decrease the impedance thereof in a frequency range.

It can also be provided for this sensitivity to manifest itself through a slight phase rotation of the signals of one of the two subsets SP1 and SP2. A capacitive or inductive element will then be integrated, in series or in parallel, in one of the two branches of the weighting circuit 71-76 considered to thus introduce a first-order filter function, low-pass or high-pass. Those skilled in the art obviously know such filters, such that there is no point in describing them here.

The above rotation therefore amounts to taking into account, for each subset SP1 or SP2, a fraction of one or several of the input signals SO1, SO2, SO3, fraction which is phase-shifted relative to the considered input signal SO1, SO2, SO3. It will be noted that the phase correction is done individually in each weighting element 71-76, i.e. although each input signal SO1, SO2, SO3 is applied to a pair of weighting elements 71-76, the phase shift of one of the weighting elements does not have repercussions on the other. In other words, the individual phase-shift adjustments are mutually independent.

Generally, the converter circuit 7 can therefore constitute an output stage of a demodulator including an input stage 3.

The converter circuit 7 corresponds to a signal processing method. It therefore involves a demodulation and processing method for eliminating parasitic components present in three mutually phase-shifted components of a baseband signal, in order to provide two quadrature demodulation components I, Q, in which:

receiving the three mutually phase-shifted components, a weighting thereof is done, and first and second additions are done of two subsets of signals thus weighted, respectively, to respectively provide the two said quadrature demodulation components I, Q.

A non-binding explanation is provided below aiming to illustrate the calculation model represented by the converter circuit 7. It must, however, be noted that this involves an explanation that, in the case where it includes imperfections, cannot call the invention into question since it effectively procures the expected results.

Annexes 1 and A and B provide additional explanations in the form of equations for signals.

ANNEX 1

By setting at a value $f_c$ the carrier frequency of the useful signal RF on the first circuit input 1 and the frequency of the local oscillator on the second circuit input 2, their bandpass representations are then given by:

$$v_{RF}(t) = \Re[z(t)e^{j2\pi f_{RF}t}] \quad (1)$$

$$v_{LO}(t) = \Re[V_{LO}e^{j2\pi f_c t}] \quad (2)$$

where $V_{LO}$ is the amplitude of the signal of the local oscillator, $f_{RF}$ is the carrier frequency of the modulated signal $v_{RF}$, $z(t) = a(t)e^{j\theta(t)} = I(t) + j*Q(t)$ is its complex envelope in which $a(t)$ and $\theta(t)$ are the amplitude and the phase of the envelope, respectively, as a function of time t. In the case of a Low-IF demodulator, the frequency $f_c$ is slightly offset from $f_{RF}$. In the case of a Zero-IF demodulator, we have $f_{RF} = f_c$. The rest of the calculations here apply to the Zero-IF case, but could be conducted identically for the Low-IF case.

The five-port junction 3 used in the demodulator can be produced either by a "five port" correlator (FIG. 2) or a "three-phase" correlator (FIG. 3). In both cases, the signals at the inputs 1 and 2, respectively represented theoretically by $v_{RF}(t)$ and $v_{LO}(t)$, are each divided into three channels. Each of the channels introduces a gain and a phase shift symbolized by Ai, Bi and γi, φi, which are respectively the modules and the arguments for complex constants unique to the circuit. In the case of the "five-port" circuit, each of the signals coming from the three channels of the second circuit input 2 is added to the RF signal $v_{RF}(t)$ of the first circuit input 1, then detected by a quadratic detector. In the case of the "three-phase" circuit each of the signals coming from the three channels of the second circuit input 2 is multiplied by the RF signal $v_{RF}(t)$ of the first circuit input 1. Lastly, the three output signals are filtered by the low-pass filters 33 to provide the three baseband output voltages.

$h_{pb}(t)$ denotes the impulse response of the low-pass filters 33 and * is the integral convolution operator.

By using the model of the circuit 3 illustrated by FIG. 2, the relationship is deduced linking the inputs 1 and 2 to the terminals 4, 5 and 6 (output, also constituting the first, second and third circuit inputs for the circuit 7) by:

$$v_i(t) = \{A_i V_{LO} \cos(2\pi f_c t + \gamma_i) + B_i a(t) \cos(2\pi f_c t + \theta(t) + \phi_i)\}^2 * h_{pb}(t) \quad i=3,4,5 \tag{3}$$

By using the model of the circuit 3 illustrated by FIG. 3 and taking into account the second-order distortion phenomenon 2 (IMD2), the relationship is deduced linking the input signals 1 and 2 to those of the terminals 4, 5 and 6 by:

$$v_i(t) = \{A_i V_{LO} \cos(2\pi f_c t + \gamma_i) \times B_i a(t) \cos(2\pi f_c t + \theta(t) + \phi_i) + \text{IMD2}\} * h_{pb}(t) \quad i=3,4,5 \tag{3-bis}$$

These last two relationships are equivalent, except that, in the case of the five-port, illustrated by FIG. 2, the terms in IMD2 are higher than those of the three-phase that is illustrated by FIG. 3.

It is assumed that the frequency response of the low-pass filters 33 is such that:

$$H_{pbi}(f) = \begin{cases} K_{bpi} & \text{if } (-B_{pb} < f < B_{pb}) \\ 0 & \text{otherwise} \end{cases} \tag{4}$$

where $2B_{pb}$ is the bandwidth of $z(t)$ in Hz. The voltages $v_i(t)$ will only have baseband components, as shown by the following expressions:

$$v_3(t) = K_{pb3} \frac{A_3^2 V_{LO}^2}{2} + K_{pb3} \frac{B_3^2 a^2(t)}{2} + K_{pb3} A_3 B_3 V_{LO} a(t) \cos[\theta(t) - \phi_3] \tag{5}$$

$$v_4(t) = K_{pb4} \frac{A_4^2 V_{LO}^2}{2} + K_{pb4} \frac{B_4^2 a^2(t)}{2} + K_{pb4} A_4 B_4 V_{LO} a(t) \cos[\theta(t) - \phi_4] \tag{6}$$

$$v_5(t) = K_{pb5} \frac{A_5^2 V_{LO}^2}{2} + K_{pb5} \frac{B_5^2 a^2(t)}{2} + K_{pb5} A_5 B_5 V_{LO} a(t) \cos[\theta(t) - \phi_5] \tag{7}$$

with $\phi_i = -(\varphi_i - \gamma_i)$ (8)

It is important to note that, in these equations, all of the mixing or quadratic detection operations of the signals as well as the imperfections of the RF circuits are taken into account.

The term $a^2(t)$, which appears in the band signal, is the square of the envelope of the signal. In the case of the model with mixers, this term may also represent the envelope of the adjacent channel taking non-linearities of the mixers into account. If the expected signal has a constant envelope, then $a^2(t)$=cte (constant) and it is therefore comprised in the DC terms, otherwise it can be written:

$$a^2(t) = Cte + a^2_{env}(t)$$

with Cte: average of $a^2(t)$(DC), and $a^2_{env}(t)$ variable portion of $a^2(t)$ with zero average.

One notes by:

$$R_i = \frac{1}{2} K_{pbi} B_i^2, \quad S_i = K_{pbi} A_i B_i V_{LO}, \tag{9}$$

$$K_i = \frac{1}{2} K_{pbi} A_i^2 B_i^2 V_{LO}^2, \quad z_I(t) = a(t)\cos\theta(t),$$

$z_Q(t) = a(t)\sin\theta(t)$ and $n(t) = a^2(t)$

Equations (5), (6) and (7) are then written:

$$v_3(t) = R_3 n(t) + S_3 \cos\phi_3 z_I(t) + S_3 \sin\phi_3 z_Q(t) + K_3 \tag{10}$$

$$v_4(t) = R_4 n(t) + S_4 \cos\phi_4 z_I(t) + S_4 \sin\phi_4 z_Q(t) + K_4 \tag{11}$$

$$v_5(t) = R_5 n(t) + S_5 \cos\phi_5 z_I(t) + S_5 \sin\phi_5 z_Q(t) + K_5 \tag{12}$$

The desired baseband signals are $z_I(t)$ and $z_Q(t)$. It is possible, by using weighting coefficients, to determine them from equations (10), (11) and (12).

$$z_I(t) = \mu_I(r_I v_3(t) + s_I v_4(t) + t_I v_5(t)) \tag{13}$$

$$z_Q(t) = \mu_Q(r_Q v_3(t) + s_Q v_4(t) + t_Q v_5(t)) \tag{14}$$

Constants $\mu_I$, $r_I$, $s_I$, $t_I$, $\mu_Q$, $r_Q$, $s_Q$ and $t_Q$ are the calibration constants usually determined by several known techniques.

$\mu_I$ and $\mu_Q$ are coefficients applied to the three voltages, and it is possible to estimate them later during the equalization operation generally performed in all demodulators.

Using a digital method during the equalization, a matrix M will be determined to link the emitted baseband terms $z_I''(t)$ and $z_Q''(t)$ to those received $z_I(t)$ and $z_Q(t)$.

$$\begin{bmatrix} z_I'' \\ z_Q'' \end{bmatrix} = M \times \begin{bmatrix} z_I \\ z_Q \end{bmatrix} \tag{15}$$

where M is a 2×2 matrix, determined as for all traditional IQ demodulators by using the learning sequence, which contains the data from the channel as well as the terms $\mu_I$ and $\mu_Q$ that are not taken into account by the analog circuit 3.

In conclusion, the demodulation operation (13) and (14) making it possible to recover the data I and Q, noted $z_I(t)$ and $z_Q(t)$, is done by the circuit 7 by implementing the weighting coefficients $r_I$, $s_I$, $t_I$, $r_Q$, $s_Q$, $t_Q$ of the elements of the bank 70. The multiplier factors $\mu_I$ and $\mu_Q$ are included in the equalization coefficients during the estimation of the radio propagation channel.

Analysis of the Two Output Components of the Circuit 7

Using again the raw output equations (10)-(12) deduced from the model without any approximation:

$$v_3(t) = R_3 n(t) + S_3 \cos\phi_3 z_I(t) + S_3 \sin\phi_3 z_Q(t) + K_3$$

$$v_4(t) = R_4 n(t) + S_4 \cos\phi_4 z_I(t) + S_4 \sin\phi_4 z_Q(t) + K_4$$

$$v_5(t) = R_5 n(t) + S_5 \cos\phi_5 z_I(t) + S_5 \sin\phi_5 z_Q(t) + K_5$$

The expressions of the output voltages (applying the equivalent calibration coefficients implemented in the circuit 7 [for more details see annex A]) are:

$$z_I'(t) = R_I n(t) + [r_I S_3 \cos\phi_3 + s_I S_4 \cos\phi_4 + t_I S_5 \cos\phi_5] z_I(t) + [r_I S_3 \sin\phi_3 + s_I S_4 \sin\phi_4 + t_I S_5 \sin\phi_5] z_Q(t) + K_I \tag{16}$$

$$z_Q'(t)=R_Q n(t)+[r_Q S_3 \cos\phi_3+s_Q S_4 \cos\phi_4+t_Q S_5 \cos\phi_5]z_I(t)+[r_Q S_3 \sin\phi_3+s_Q S_4 \sin\phi_4+t_Q S_5 \sin\phi_5]z_Q(t)+K_Q \qquad (17)$$

with, at output 78S and 77S of the circuit 7, the multiplier terms of the parasitic voltages due to the IMD2:

$$R_I=r_I R_3+s_I R_4+t_I R_5 \text{ and } R_Q=r_Q R_3+s_Q R_4+t_Q R_5 \qquad (18)$$

and those due to the DC-offsets:

$$K_I=r_I K_3+s_I K_4+t_I K_5 \text{ and } K_Q=r_Q K_3+s_Q K_4+t_Q K_5 \qquad (19)$$

It is demonstrated, using the last two equations and through the development done in Annex B, that the terms $R_I$, $R_Q$, $K_I$ and $K_Q$ ideally cancel each other out and they are lower than those that would be obtained at output of the circuit 3 in the absence of the analog circuit 7. This makes it possible to conclude that the parasitic voltages due to the DC-offset and IMD2 are reduced before digitization of the signals. This allows gains in measuring dynamics. It is important to note that the traditional IQ demodulators with 2 RF channels require algorithms for evaluating the DC-offsets and 2 ADC converters for compensation thereof before digitization. This amounts to a loss of information resulting from the equivalent high-pass filtering and a complexity of the demodulator. Moreover, the reduction of the IMD2 in the traditional IQ demodulators with 2 channels requires adding a channel and additional digital processing.

Results of Measurements on a Five-Port Prototype with Microstrip Technology

Useful Signals and DC-Offset

FIG. 7 presents the three voltages V1, V2, V3 of the terminals 4, 5, 6 at output of a five-port circuit 3 used to test the circuit 7 and the two output voltages I and Q of the circuit 7.

The test and measurement conditions are as follows.

The circuit 3 is a five-port ring with microstrip technology. The circuit 3 operates in the 1.6 GHz to 2.8 GHz band.

The circuit 7 is associated with the circuit 3 to form a complete Zero-IF demodulator.

A RF SSB (Single Side Band) signal is applied to the input 1 with a frequency of 1.84001 GHz with a global power level of −25 dBm.

Measurements in dB are expressed on a base 10 scale, because the voltages come from quadratic detectors.

The input 2 is supplied by a local oscillator source delivering a constant RF signal with a frequency of 1.84 GHz and a power level of 0 dBm.

The voltages measured at the output terminals of the five-port 4, 5 and 6 respectively yield DC-offset levels of 105 mV, 108 mV and 102 mV.

On the other hand, the latter voltages applied to the circuit 7 yield, at output I (78S) and Q (77S), a respective DC-offset level of 4.1 mV and 0.12 mV, therefore close to 100 mV less or 25 times lower at the minimum (14 dB less) on channel I and 800 times lower on channel Q, or 30 dB less.

FIGS. 8, 9, 10, 11 and 12 respectively show the power spectrum of the outputs 4, 5, 6, as well as I (78S) and Q (77S). These spectrums show the line of the useful signal at ±100 kHz as well as the DC-offset component at the zero frequency. It is important to note that the useful signal level is preserved at the output of the circuit 7 while considerably reducing the DC-offset level. This DC-offset reduction gain manifests itself directly as a measuring dynamic gain.

Measuring Dynamics:

The digital processing of the signals in the receivers is essential, and, to that end, two or three analog-to-digital converters will be used. The ADC has characteristics that determine its dimensions, such as the sampling frequency (Fe), the number of bits (NB), the LSB (least significant bit) and the full scale (FS).

Assume now that we are aiming to demodulate the signal directly from the terminals 4, 5 and 6. It is first necessary to perform an amplification before digital conversion. Imagine that the full scale is FS=±15 V. According to FIG. 7, the saturation of the three converters will be achieved for an amplification that brings the output voltages to the full scale level FS. In this scenario:

Assume that we use three AGC (automatic gain control) amplifiers at the terminals 4, 5 and 6, the maximum gain on each amplifier before reaching the saturation of the ADCs will be:

AGC03=21 dB

On the other hand, the same AGCs placed at output of the circuit 7 will have for value:

AGC07=31 dB

This represents a "gain" or extension of 10 dB in measuring dynamics for this scenario. The "gain" will have been even higher if the RF power at the input 1 had been at the minimum detection level of the circuit 3.

The DC-offset residue remaining at output of the circuit 7 is easily removed in digital.

FIG. 13 shows the evolution of the DC-offset at the terminals 4, 5 and 6 and also at the outputs of I (78S) and Q (77S) as a function of the power of the local oscillator LO. The DC-offset level due to the local oscillator at output I and Q is much lower than that at the terminals 4, 5 and 6. This also makes it possible to have a technique for combating the leakage of the local oscillator LO.

FIG. 14 shows the evolution of the DC-offset at the terminals 4, 5 and 6 as well as at the outputs I (78S) and Q (77S) as a function of the frequency of the local oscillator LO. Likewise, the DC-offset level at the outputs I and Q remains lower, regardless of the frequency of the local oscillator LO.

Reduction of the Second-Order Intermodulation

FIG. 15 shows the baseband product of the second-order intermodulation due to the mixers as a function of the power of an adjacent bi-tone channel. As shown, the rejection "gain" or improvement obtained owing to the circuit 7 is about 20 dB. This allows a Zero-IF demodulator, with a base of a three-phase or five-port circuit 3 using the circuit 7, to have a second-order intermodulation level, IIP2, 20 dB above that of the mixers 32.

Phase Shift of the Components of Channel I and Q

It has been theoretically demonstrated here that the phase between channels I and Q stays constant while the phase shifts between channels 4, 5 and 6 were ±γ. FIG. 16 validates the theory by showing the analog phase shift between channels I and Q before equalization. The phase shift is measured as a function of the frequency for different power levels of the RF signal at the input 1. FIG. 16 clearly shows that the phase shift has good stability in the entire band from 1.6 GHz to 2.8 GHz. Indeed, although the phase shift between the channels of terminals 4, 5 and 6 evolves slightly as a function of the frequency, the channels I and Q remain sufficiently phase-shifted to guarantee a good quality of the signal as a function of the frequency variation. This technique thus makes it possible to produce very broadband Zero-IF demodulators by using only two output channels.

Demodulation Quality

FIG. 17, showing a demodulated QPSK constellation from outputs of the circuit 7, makes it possible to confirm the validity of the principle of the invention. The equalization of the received signals has indeed taken into account the terms μI and μQ, from which it results that the constellation is perfectly balanced. The areas around the four points with coordinates ±1, ±1 show the decision moment and demonstrate that the symbol synchronization took place.

The EVM (Error Vector Magnitude) was chosen as a figure of merit to judge the demodulation quality as a function of the frequency for a RF signal with set power at the input 1. FIG. 18 shows the results of the measurement of the EVM done on the constellation. The EVM continues to be of high quality all along the 1.6 GHz-2.8 GHz band.

CONCLUSION

The results of measurements demonstrate that it is possible to demodulate the signal from a five-port or three-phase circuit by using the circuit 7.

The circuit 7 makes it possible to:
omit the digital calibration step,
apply good coefficients without using an arithmetic unit,
omit an ADC (only two instead of three),
reduce the DC-offset without using another circuit,
reduce the IMD2 without using another circuit,
improve the measuring dynamics,
guarantee a substantially constant phase shift between channels I and Q as a function of the frequency,
guarantee a substantially constant demodulation quality in the entire band.

The circuit 7 does not require an adjustment of the weighting coefficients.

The circuit 7 does not impose any constraints on the signals at the inputs 1 and 2.

The circuit 7 does not require any particular manipulation, human or software-based.

The circuit 7 is applicable to any circuit using the five-port or three-phase principle.

The circuit 7, with limited bulk, can thus be easily integrated into any technologies.

ANNEX A

From equations (10), (11) and (12), for mathematical simplification reasons, it is assumed that the terms in $K_i$ can be estimated by taking an average of the voltages of the terminals 4, 5 and 6 and, subsequently, the voltages $v_i(t)$ are eliminated and lastly, the following expressions are obtained:

$$\tilde{v}_i(t) = v_i(t) - K \tag{A-1}$$

which yields, from equations (10), (11) and (12):

$$\tilde{v}_3(t) = R_3 n(t) + S_3 \cos\phi_3 z_I(t) + S_3 \sin\phi_3 z_Q(t) \tag{A-2}$$

$$\tilde{v}_4(t) = R_4 n(t) + S_4 \cos\phi_4 z_I(t) + S_4 \sin\phi_4 z_Q(t) \tag{A-3}$$

$$\tilde{v}_5(t) = R_5 n(t) + S_5 \cos\phi_5 z_I(t) + S_5 \sin\phi_5 z_Q(t) \tag{A-4}$$

In matricial form these last three equations are written:

$$\begin{bmatrix} \tilde{v}_3(t) \\ \tilde{v}_4(t) \\ \tilde{v}_5(t) \end{bmatrix} = \begin{bmatrix} R_3 & S_3\cos\phi_3 & S_3\sin\phi_3 \\ R_4 & S_4\cos\phi_4 & S_4\sin\phi_4 \\ R_5 & S_5\cos\phi_5 & S_5\sin\phi_5 \end{bmatrix} \cdot \begin{bmatrix} n(t) \\ z_I(t) \\ z_Q(t) \end{bmatrix} \tag{A-5}$$

Having voltages $v_i$, we look for $z_I$ and $z_Q$, the matricial relationship is:

$$\begin{bmatrix} n(t) \\ z_I(t) \\ z_Q(t) \end{bmatrix} = \begin{bmatrix} r_n & s_n & t_n \\ r_I & s_I & t_I \\ r_Q & s_Q & t_Q \end{bmatrix} \begin{bmatrix} \tilde{v}_3(t) \\ \tilde{v}_4(t) \\ \tilde{v}_5(t) \end{bmatrix}. \tag{A-6}$$

$n(t)$ being an unwanted signal, what interests us are the relationships:

$$z_I(t) = r_I \tilde{v}_3(t) + s_I \tilde{v}_4(t) + t_I \tilde{v}_5(t) \tag{A-7}$$

$$z_Q(t) = r_Q \tilde{v}_3(t) + s_Q \tilde{v}_4(t) + t_Q \tilde{v}_5(t) \tag{A-8}$$

Knowing that $$\begin{bmatrix} r_n & s_n & t_n \\ r_I & s_I & t_I \\ r_Q & s_Q & t_Q \end{bmatrix} = inv \begin{bmatrix} R_3 & S_3\cos\phi_3 & S_3\sin\phi_3 \\ R_4 & S_4\cos\phi_4 & S_4\sin\phi_4 \\ R_5 & S_5\cos\phi_5 & S_5\sin\phi_5 \end{bmatrix} \tag{A-9}$$

we can deduce $$r_Q = \frac{1}{S_3 \chi}\left[\frac{R_5 S_4}{R_3 S_3}\cos\phi_4 - \frac{R_4 S_5}{R_3 S_3}\cos\phi_5\right] \tag{A-10}$$

$$s_Q = \frac{1}{S_3 \chi}\left[\frac{S_5}{S_3}\cos\phi_5 - \frac{R_5}{R_3}\cos\phi_3\right] \tag{A-11}$$

$$t_Q = \frac{1}{S_3 \chi}\left[\frac{R_4}{R_3}\cos\phi_3 - \frac{S_4}{S_3}\cos\phi_4\right] \tag{A-12}$$

$$r_I = \frac{1}{S_3 \chi}\left[\frac{R_4 S_5}{R_3 S_3}\sin\phi_5 - \frac{R_5 S_4}{R_3 S_3}\sin\phi_4\right] \tag{A-13}$$

$$s_I = \frac{1}{S_3 \chi}\left[\frac{R_5}{R_3}\sin\phi_3 - \frac{S_5}{S_3}\sin\phi_5\right] \tag{A-14}$$

$$t_I = \frac{1}{S_3 \chi}\left[\frac{S_1}{S_3}\sin\phi_4 - \frac{R_4}{R_3}\sin\phi_3\right] \tag{A-15}$$

with $$\chi = \frac{R_5 S_4}{R_3 S_3}\sin(\phi_3 - \phi_4) + \frac{R_4 S_5}{R_3 S_3}\sin(\phi_5 - \phi_3) + \frac{S_4 S_5}{S_3^2}\sin(\phi_4 - \phi_5) \tag{A-16}$$

In order to guarantee equal-interval scaling of the power, the design of the circuit 3 is done so as to obtain a symmetry between the channels. This is equivalent to saying, as a function of the terms developed in the model in FIG. 2 and FIG. 3:

$$A_1 = A_2 = A_3 \text{ and } B_1 = B_2 = B_3 \tag{A-17}$$

From the latter conditions follows the following relationship:

$$R_1 = R_2 = R_3 \text{ and } S_1 = S_2 = S_3 = S \tag{A-18}$$

Taking relationships (22)-(30) into account, one writes:

$$\chi = \sin(\phi_3 - \phi_4) + \sin(\phi_5 - \phi_3) + \sin(\phi_4 - \phi_5) \tag{A-19}$$

$$r_I = \frac{1}{S\chi}[\sin\phi_5 - \sin\phi_4] \tag{A-20}$$

$$s_I = \frac{1}{S\chi}[\sin\phi_3 - \sin\phi_5] \tag{A-21}$$

$$t_I = \frac{1}{S\chi}[\sin\phi_4 - \sin\phi_3] \tag{A-22}$$

$$r_Q = \frac{1}{S\chi}[\cos\phi_4 - \cos\phi_5] \tag{A-23}$$

$$s_Q = \frac{1}{S\chi}[\cos\phi_5 - \cos\phi_3] \tag{A-24}$$

$$t_Q = \frac{1}{S\chi}[\cos\phi_3 - \cos\phi_4] \qquad (A-25)$$

In a receiver use of the "five-port" or "three-phase" circuit 3, a calibration operation consists of injecting a known signal at the input 1 and then resolving the system to estimate the calibration constants $r_I$, $s_I$, $t_I$, $r_Q$, $s_Q$ and $t_Q$ except that, after that operation, during its use in a real system where, at the input 1, a receiver antenna is located, the attenuation and phase-shift contributed by the channel are not taken into account by these constants, with the result that a second calibration, called equalization, is done in all types of demodulators. Therefore, knowing that the equalization will subsequently be done, the amplitude correction is not necessary during calibration of the circuit 3, since it will be done during the equalization, but the relationship allowing the transition from the three-phase space to the two-phase one is important to determine. Thus, the variable S, in the equations from (A-20) to (A-25), can be eliminated in the calibration step.

Which gives:

$$r'_I = \frac{1}{\chi}[\sin\phi_5 - \sin\phi_4] \qquad (A-26)$$

$$s'_I = \frac{1}{\chi}[\sin\phi_3 - \sin\phi_5] \qquad (A-27)$$

$$t'_I = \frac{1}{\chi}[\sin\phi_4 - \sin\phi_3] \qquad (A-28)$$

$$r'_Q = \frac{1}{\chi}[\cos\phi_4 - \cos\phi_5] \qquad (A-29)$$

$$s'_Q = \frac{1}{\chi}[\cos\phi_5 - \cos\phi_3] \qquad (A-30)$$

$$t'_Q = \frac{1}{\chi}[\cos\phi_3 - \cos\phi_4] \qquad (A-31)$$

Knowing that $$\sin a - \sin b = 2\sin\left(\frac{a-b}{2}\right)\cos\left(\frac{a+b}{2}\right)$$

and that $$\cos a - \cos b = -2\sin\left(\frac{a-b}{2}\right)\sin\left(\frac{a+b}{2}\right) \qquad (A-32)$$

$$r'_I = \frac{2}{\chi}\left[\sin\left(\frac{\phi_5 - \phi_4}{2}\right)\cos\left(\frac{\phi_5 + \phi_4}{2}\right)\right] \qquad (A-33)$$

$$s'_I = \frac{2}{\chi}\left[\sin\left(\frac{\phi_3 - \phi_5}{2}\right)\cos\left(\frac{\phi_3 + \phi_5}{2}\right)\right] \qquad (A-34)$$

$$t'_I = \frac{2}{\chi}\left[\sin\left(\frac{\phi_4 - \phi_3}{2}\right)\cos\left(\frac{\phi_4 + \phi_3}{2}\right)\right] \qquad (A-35)$$

$$r'_Q = \frac{-2}{\chi}\left[\sin\left(\frac{\phi_4 - \phi_5}{2}\right)\sin\left(\frac{\phi_4 + \phi_5}{2}\right)\right] \qquad (A-36)$$

$$s'_Q = \frac{-2}{\chi}\left[\sin\left(\frac{\phi_5 - \phi_3}{2}\right)\sin\left(\frac{\phi_5 + \phi_3}{2}\right)\right] \qquad (A-37)$$

$$t'_Q = \frac{-2}{\chi}\left[\sin\left(\frac{\phi_3 - \phi_4}{2}\right)\sin\left(\frac{\phi_3 + \phi_4}{2}\right)\right] \qquad (A-38)$$

Now assume that:

$$\phi_3 = c_0 + \gamma, \phi_4 = c_0 \text{ and } \phi_5 = c_0 - \gamma \qquad (A-39)$$

(31) and (51) give $\chi = \sin(\gamma)$ \qquad (A-40)

According to equations (45)-(50) and (51) it can be deduced that:

$$r'_I = \frac{2}{\chi}\left[\sin\left(\frac{-\gamma}{2}\right)\cos\left(\frac{2C_0 - \gamma}{2}\right)\right] \qquad (A-41)$$

$$s'_I = \frac{2}{\chi}\left[\sin\gamma\cos\left(\frac{2C_0}{2}\right)\right] \qquad (A-42)$$

$$t'_I = \frac{2}{\chi}\left[\sin\left(\frac{-\gamma}{2}\right)\cos\left(\frac{2C_0 + \gamma}{2}\right)\right] \qquad (A-43)$$

$$r'_Q = \frac{-2}{\chi}\left[\sin\left(\frac{\gamma}{2}\right)\sin\left(\frac{-\gamma + 2C_0}{2}\right)\right] \qquad (A-44)$$

$$s'_Q = \frac{-2}{\chi}\left[\sin(-\gamma)\sin\left(\frac{2C_0}{2}\right)\right] \qquad (A-45)$$

$$t'_Q = \frac{-2}{\chi}\left[\sin\left(\frac{\gamma}{2}\right)\sin\left(\frac{2C_0 + \gamma}{2}\right)\right] \qquad (A-46)$$

Knowing that $\chi = 2\sin(\gamma/2)\cos(\gamma/2)$ \qquad (A-47)

$$r'_I = \frac{-1}{\cos\left(\frac{\gamma}{2}\right)}\left[\cos\left(\frac{2C_0 - \gamma}{2}\right)\right] \qquad (A-48)$$

$$s'_I = 2[\cos(C_0)] \qquad (A-49)$$

$$t'_I = \frac{-1}{\cos\left(\frac{\gamma}{2}\right)}\left[\cos\left(\frac{2C_0 + \gamma}{2}\right)\right] \qquad (A-50)$$

$$r'_Q = \frac{-1}{\cos\left(\frac{\gamma}{2}\right)}\left[\sin\left(\frac{-\gamma + 2C_0}{2}\right)\right] \qquad (A-51)$$

$$s'_Q = 2[\sin C_0] \qquad (A-52)$$

$$t'_Q = \frac{-1}{\cos\left(\frac{\gamma}{2}\right)}\left[\sin\left(\frac{2C_0 + \gamma}{2}\right)\right] \qquad (A-53)$$

As it can be seen, $C_0$ corresponds to a rotation of the matrix formed by the constants $r_I$, $s_I$, $t_I$, $r_Q$, $s_Q$ and $t_Q$ and that is also taken into account during the equalization procedure, such that it is justified to consider that $C_0 = 0$.

$$r'_I = -1 \qquad (A-54)$$

$$s'_I = 2 \qquad (A-55)$$

$$t'_I = -1 \qquad (A-56)$$

Note: these values are determined regardless of $\gamma$, the phase shift of the output signals.

$$r'_Q = \tan\left(\frac{\gamma}{2}\right) \tag{A-57}$$

$$s'_Q = 0 \tag{A-58}$$

$$t'_Q = -\tan\left(\frac{\gamma}{2}\right) \tag{A-59}$$

Note: these values are all expressed linearly as a function of $$\tan\left(\frac{\gamma}{2}\right).$$

Given that the term $$\tan\left(\frac{\gamma}{2}\right)$$

appears on the three constants, it will be a factor for $z_Q$ (it is taken into account in $\mu_Q$ (14)), and therefore it can also be estimated during the equalization procedure, and lastly the simplest and most generalized expression is obtained, regardless of $\gamma$, of the calibration constants.

$$r'_I = -1 \tag{A-60}$$

$$s'_I = 2 \tag{A-61}$$

$$t'_I = -1 \tag{A-62}$$

$$r'_Q = 1 \tag{A-63}$$

$$s'_Q = 0 \tag{A-64}$$

$$t'_Q = -1 \tag{A-65}$$

And thus one writes:

$$z_I'(t) = -v_3(t) + 2v_4(t) - v_5(t) \tag{A-66}$$

$$z_Q'(t) = v_3(t) - v_5(t) \tag{A-67}$$

ANNEX B

Without any supposition according to the latter expressions, the disrupting terms such as the DC-offset ($K_I$ and $K_Q$) and the terms in IMD2 ($R_I$ et $R_Q$) will be eliminated in the best case (symmetry of the channels) and, otherwise, in case of dissymmetry of the channels, they will be very weak. The measurements presented in FIGS. 7 to 15 validate this statement. A rejection of the DC-offset is thus obtained in the vicinity of 30 dB and also a rejection of the IMD2 in the vicinity of 20 dB.

The reduction of the DC-offset is one of the solutions provided by this principle, and this makes it possible to use video amplifiers at the output of the demodulators without handicapping the measurement dynamics. Reducing the IMD2 is also an advantage of this technique without calling on additional algorithms.

Another aspect of the contribution by the present invention is the reduction, by one unit, of the number of ADC converters. Another advantage on the orthogonality conditions (90°) of the channels I and Q also appears and, to explain it in more detail, some mathematical operations are performed.

Considering the useful signal at the output of the circuit 7, one notes:

$$z_I'(t) = z_I''(t) + N_I \text{ and } z_Q'(t) = z_Q''(t) + N_Q \tag{B-1}$$

with $$z_I''(t) = [-S_3 \cos \phi_3 + 2S_4 \cos \phi_4 - S_5 \cos \phi_5] z_I(t) + [-S_3 \sin \phi_3 + 2S_4 \sin \phi_4 - S_5 \sin \phi_5] z_Q(t) \tag{B-2}$$

$$z_Q''(t) = [S_3 \cos \phi_3 - S_5 \cos \phi_5] z_I(t) + [S_3 \sin \phi_3 - S_5 \sin \phi_5] z_Q(t) \tag{B-3}$$

$N_I$ and $N_Q$ are the unwanted signals, to be eliminated

In vectorial form, we write:

$$\begin{bmatrix} z_I''(t) \\ z_Q''(t) \end{bmatrix} = \begin{bmatrix} \begin{bmatrix} -S_3\cos\phi_3 + \\ 2S_4\cos\phi_4 - S_5\cos\phi_5 \end{bmatrix} & \begin{bmatrix} -S_3\sin\phi_3 + \\ 2S_4\sin\phi_4 - \\ S_5\sin\phi_5 \end{bmatrix} \\ [S_3\cos\phi_3 - S_5\cos\phi_5] & \begin{bmatrix} S_3\sin\phi_3 - \\ S_5\sin\phi_5 \end{bmatrix} \end{bmatrix} \times \begin{bmatrix} z_I(t) \\ z_Q(t) \end{bmatrix} \tag{B-4}$$

or in other words, $$\begin{bmatrix} z_I''(t) \\ z_Q''(t) \end{bmatrix} = \begin{bmatrix} \vec{a}_I \\ \vec{a}_Q \end{bmatrix} \times \begin{bmatrix} z_I(t) \\ z_Q(t) \end{bmatrix} \tag{B-5}$$

$\vec{a}_I$ and $\vec{a}_Q$ being the vectorial base linking the output signals of the five-port or three-phase circuit 3 to the output $z_I$ and $z_Q$.

The orthogonality between $z_I$ and $z_Q$ is determined for a good demodulation quality. The orthogonality between $z_I$ and $z_Q$ will depend on the orthogonality between $\vec{a}_I$ and $\vec{a}_Q$.

The vectorial product of the two vectors $\vec{a}_I$ and $\vec{a}_Q$ yields:

$$\vec{a}_I \times \vec{a}_Q = [-S_3 \cos \phi_3 + 2S_4 \cos \phi_4 - S_5 \cos \phi_5] \cdot [S_3 \cos \phi_3 - S_5 \cos \phi_5] + [-S_3 \sin \phi_3 + 2S_4 \sin \phi_4 - S_5 \sin \phi_5] \cdot [S_3 \sin \phi_3 - S_5 \sin \phi_5] \tag{B-6}$$

$$= 2S_3 S_4 \cos(\phi_3 - \phi_4) - 2S_5 S_4 \cos(\phi_5 - \phi_4) \tag{B-7}$$

$\vec{a}_I$ and $\vec{a}_Q$ are orthogonal if:

$$\vec{a}_I \times \vec{a}_Q = 0 \tag{B-8}$$

which is equivalent according to (B-7) to:

$$2S_3 S_4 \cos(\phi_3 - \phi_4) - 2S_5 S_4 \cos(\phi_5 - \phi_4) = 0 \tag{B-9}$$

In this last expression, it is deduced that, to guarantee orthogonality of the channels I and Q, it suffices to meet the conditions of equation (B-9), which, technically, means that it is necessary for the five-port to be phase symmetrical and for the channel i=3 to be identical to the channel i=5 in terms of gain. The majority of five-port architectures in the literature meet this condition, and more particularly the five-port ring is an example of a five-port satisfying this condition.

Therefore, although the phases of the vectorial base evolve as a function of the frequency $f_c$ at the output of the demodulator using the principle according to the invention, the channel I remains orthogonal to the channel Q as long as the phase evolution verifies the condition:

$$|\phi_3(f_c) - \phi_4(f_c)| = |\phi_5(f_c) - \phi_4(f_c)| \tag{B-10}$$

This is verified by the measurement results presented in FIG. 16.

The invention claimed is:

1. An analog circuit (7) for demodulating three mutually phase-shifted components of a baseband signal, in order to provide two quadrature demodulation components (I, Q), characterized in that it includes:
- three circuit inputs (4, 5, 6), designed to received said three components, respectively,
- first and second adder circuits (77, 78), and
- a bank (70) of weighting circuits (71, 72, 73, 74, 75, 76) linked, at input, to the three circuit inputs (4, 5, 6) and linked, at output, to inputs of the first and second adder circuits (77, 78) so as to transmit to each adder input, with a determined weighting, at least one of said three components, the weightings being chosen so that the first and second adder circuits (77, 78) provide respectively said two quadrature demodulation components (I, Q) before digitization;

wherein the first adder circuit (77) includes a first operational amplifier (AO1) including first and second inputs, inversion and direct inputs, respectively, connected to two said circuit inputs (4, 6) by first and fifth weighting circuits (71, 75), respectively.

2. The circuit according to claim 1, wherein at least one of the first and second adder circuits (77, 78) is linked at input to three of the weighting circuits (74, 75, 76).

3. The circuit according to claim 2, wherein the first and second adder circuits (77, 78) can be linked at input to three of the weighting circuits (71, 72, 73 and 74, 75, 76).

4. The circuit according to claim 1, wherein the bank (70) includes six weighting circuits.

5. The circuit according to claim 1, wherein the weighting circuits each have a predetermined weighting factor.

6. The circuit according to claim 1, wherein one of said inputs of the first operational amplifier (AO1) is also linked to a second (5) of said circuit inputs by a third weighting circuit (73).

7. The circuit according to claim 1, wherein the second adder circuit (78) includes a second operational amplifier (AO2) whereof an adder input is linked to two of the circuit inputs (4, 6) through second and sixth weighting circuits (72, 76), and a third operational amplifier (AO3) has an adder input linked to the second circuit input (5) through a fourth weighting circuit (74) and also linked to an output of the second operational amplifier (AO2) through a seventh weighting circuit (79).

8. The circuit according to claim 7, wherein the fourth weighting circuit (74) has a weighting coefficient with a value substantial twice that of a weighting coefficient of the seventh weighting circuit (79).

9. A demodulator having an output stage including a circuit according to claim 1.

10. A method for demodulating three mutually phase-shifted components (SO1, SO2, SO3) of a baseband signal, so as to provide two quadrature demodulation components (I, Q), characterized in that:
- receiving the three mutually phase-shifted components (SO1, SO2, SO3);
- performing a weighting thereof; and
- first and second additions of signals thus weighted are done, to respectively provide the two said quadrature demodulation components (I, Q) before digitization;

wherein the first addition of signal are performed by a first operational amplifier (AO1) receiving first and second inputs, inversion and direct inputs, respectively, connected to two circuit inputs (4, 6) by first and fifth weighting circuits (71, 75), respectively.

* * * * *